United States Patent
Rapaka et al.

(10) Patent No.: US 11,822,414 B2
(45) Date of Patent: Nov. 21, 2023

(54) PROCESSOR-BASED SYSTEM EMPLOYING CONFIGURABLE LOCAL FREQUENCY THROTTLING MANAGEMENT TO MANAGE POWER DEMAND AND CONSUMPTION, AND RELATED METHODS

(71) Applicant: Microsoft Technology Licensing, LLC, Redmond, WA (US)

(72) Inventors: Smitha L. Rapaka, San Jose, CA (US); Xiaoling Xu, Cuppertino, CA (US); Venkatesh Balasubramanian, San Jose, CA (US); Sunil K. Vemula, Sunnyvale, CA (US); Derek E. Gladding, Poughquag, NY (US); Cesar Maldonado, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/170,418

(22) Filed: Feb. 8, 2021

(65) Prior Publication Data
US 2022/0253120 A1 Aug. 11, 2022

(51) Int. Cl.
G06F 1/00 (2006.01)
G06F 1/324 (2019.01)
(Continued)

(52) U.S. Cl.
CPC .............. G06F 1/324 (2013.01); G06F 1/08 (2013.01); G06F 11/3024 (2013.01); H03L 7/0802 (2013.01)

(58) Field of Classification Search
CPC ........ G06F 1/324; G06F 1/08; G06F 11/3024; G06F 1/06; G06F 1/3296; H03L 7/0802
See application file for complete search history.

(56) References Cited

U.S. PATENT DOCUMENTS

| | | |
|---|---|---|
| 5,760,636 A | 6/1998 | Noble et al. |
| 11,327,552 B1 | 5/2022 | Rapaka et al. |

(Continued)

FOREIGN PATENT DOCUMENTS

WO 2019212541 A1 11/2019

OTHER PUBLICATIONS

Non-Final Office Action for U.S. Appl. No. 17/178,041, dated Sep. 13, 2021, 17 pages.
(Continued)

*Primary Examiner* — Xuxing Chen
(74) *Attorney, Agent, or Firm* — Withrow & Terranova, PLLC

(57) ABSTRACT

Processor-based systems employing configurable local frequency throttling management to manage power demand and consumption, and related methods. For example, such processor-based systems may include a processor and other power circuitry to control power to the processor. The processor includes a clock control circuit that is configured generate a clock signal(s) at a designated frequency to clock a processor core(s) in the processor at a desired operating frequency(ies). The clock control circuit is configured to dynamically throttle (i.e., limit and/or reduce) the frequency (ies) of a clock signal(s) clocking the processor in response to a frequency throttle event that may be an unexpected event. Reducing power demand may be important to ensure that the processor can continue to operate under interrupted or reduced power supply conditions. It may be faster to throttle the operating frequency of a processor than to throttle the operating voltage of power supplied to the processor.

23 Claims, 12 Drawing Sheets

(51) Int. Cl.
*G06F 1/08* (2006.01)
*G06F 11/30* (2006.01)
*H03L 7/08* (2006.01)

(56) References Cited

U.S. PATENT DOCUMENTS

| | | |
|---|---|---|
| 2002/0133729 A1 | 9/2002 | Therien et al. |
| 2003/0110012 A1 | 6/2003 | Orenstien et al. |
| 2004/0071184 A1 | 4/2004 | Naveh et al. |
| 2004/0073821 A1 | 4/2004 | Naveh et al. |
| 2005/0188235 A1 | 8/2005 | Atkinson |
| 2007/0250219 A1 | 10/2007 | Gaskins et al. |
| 2010/0095137 A1 | 4/2010 | Bieswanger et al. |
| 2011/0035611 A1 | 2/2011 | Brey et al. |
| 2011/0178652 A1 | 7/2011 | Carter et al. |
| 2012/0169746 A1* | 7/2012 | Samson ............ G09G 5/363 345/520 |
| 2015/0033062 A1* | 1/2015 | Tsao ............ G06F 1/324 713/501 |
| 2016/0147280 A1 | 5/2016 | Thomas et al. |
| 2018/0137668 A1* | 5/2018 | Mercati ............ G06F 8/41 |
| 2019/0173454 A1* | 6/2019 | Jun ............ G09G 3/3225 |
| 2021/0124407 A1 | 4/2021 | HÖppner et al. |
| 2022/0261064 A1 | 8/2022 | Rapaka et al. |

OTHER PUBLICATIONS

"Notice of Allowance Issued in U.S. Appl. No. 17/178,041", dated Jan. 12, 2022, 7 Pages.

"Invitation to Pay Additional Fees Issued in PCT Application No. PCT/US22/013028", dated May 10, 2022, 25 Pages.

"International Search Report and Written Opinion Issued in PCT Application No. PCT/US22/013583", dated May 11, 2022, 12 Pages.

"International Search Report & Written Opinion issued in PCT Application No. PCT/US22/013028", dated Jul. 7, 2022, 28 Pages.

"Non Final Office Action Issued in U.S. Appl. No. 17/739,793", dated Nov. 22, 2022, 17 Pages.

"Notice of Allowance Issued in U.S. Appl. No. 17/739,793", dated Mar. 8, 2023, 8 Pages.

* cited by examiner

| | OP. VOLTAGE | OP. FREQUENCY | |
|---|---|---|---|
| 902(1) | 904(1) | 906(1) | } 908(1)(1) |
| | | | } 908(1)(2) |
| | ⋮ | ⋮ | |
| | | | } 908(1)(Y) |
| 902(2) | 904(2) | 906(2) | } 908(2)(1) |
| | | | } 908(2)(1) |
| | ⋮ | ⋮ | |
| | | | } 908(2)(Y) |
| | ⋮ | ⋮ | |
| 902(X) | 904(X) | 906(X) | } 908(X)(1) |
| | | | } 908(X)(2) |
| | ⋮ | ⋮ | |
| | | | } 908(X)(Y) |

PROCESSOR-BASED SYSTEM EMPLOYING CONFIGURABLE LOCAL FREQUENCY THROTTLING MANAGEMENT TO MANAGE POWER DEMAND AND CONSUMPTION, AND RELATED METHODS

FIELD OF THE DISCLOSURE

The technology of the disclosure relates to control of power demand and consumption in a processing unit, such as a central processing unit (CPU), in a processor-based system, including in a system-on-a-chip (SoC).

BACKGROUND

Data centers are integral parts of enterprise systems to support computer business applications and to provide computer-related services. Data centers can provide cloud-based computer services including data storage, data management, and software application hosting. Data centers can also be utilized to perform big data applications such as machine learning and artificial intelligence applications, for example. Data centers include storage systems, computer servers, and related network infrastructure to facilitate communications with computer servers. For example, FIG. 1A illustrates a data center 100 which includes 'M' number of server racks 102(1)-102(M). Each server rack 102(1)-102(M) is configured to house 'N' number of processor-based systems 104(1)(1)-104(M)(N) in this example. Each processor-based system 104(1)(1)-104(M)(N) is provided in the form of a printed circuit board (PCB), also sometimes referred to as a "card" or "blade." FIG. 1B illustrates a server rack 102 in the data center 100 in FIG. 1A. As shown in FIG. 1B, the processor-based systems 104 are supported in respective chassis equipment 106, that may be in the form of an equipment tray, that is installed in a respective slot 108(1)-108(N) of a server rack 102. A processor-based system 104 is communicatively coupled in the data center 100 through a backplane interface connector 110 that is connected to a backplane connector 112 of the processor-based system 104 when the processor-based system 104 is fully installed in its respective slot 108(1)-108(N) in the server rack 102.

Data center processor-based systems, such as the processor-based systems 104 in FIGS. 1A and 1B, are provided on a blade or card as an integrated circuit (IC) that includes one or more central processing units (CPUs). For example, the processor-based system can be configured as a computer server, or as a dedicated processor-based system to perform specific applications and tasks depending on the application. The CPU(s) provided in a processor-based system on a blade or card can be single processor core ("core") CPU or a multi-core CPU. The CPU can be provided in an IC chip that is system-on-a-chip (SoC) which also includes other supporting components on the same semiconductor die and IC chip, such as memory, interface circuits, modems, etc.

As discussed above, data centers can be particularly useful to support large numbers of processor-based systems to support applications and workloads. For processor-based systems to provide high performance, they need to consume a significant amount of power to be able to operate at higher operating frequencies. The need for CPUs in processor-based systems to operate at higher operating frequencies is a function of the workloads being performed and the desired performance in executing these workloads. However, power available to be consumed by processor-based systems in a data center may be limited by the power distribution system capability and distribution in the data center. For example, the data center may be capable of distributing power to each of the processor-based systems therein according to a fixed power budget established for each processor-based system. The workloads of the processor-based systems may be well known such that a fixed power budget can be established and the processor-based systems achieve the desired performance.

There can be sudden changes in the power availability to a processor-based system that can affect performance. For example, uninterruptable power supply (UPS) changes can reduce power available to be consumed by a processor-based system. Further, as another example, a voltage regulation circuit in a processor-based system may limit power available to be consumed for a number of reasons. As another example, a processor-based system may be capable to self-throttle power based on thermal considerations and enter a low-power state when temperature exceeds a defined temperature threshold to reduce dissipated heat. This can impact power distribution to the processor-based systems and thus the CPU performance in the processor-based systems. A sudden reduction in power made available to a processor in a processor-based system can lead to what is known as "di/dt" issues that can cause brown-out conditions for the processor thus leading to an interruption in operation. Since a power delivery system has substantial parasitic inductance, current variation caused by a sudden change in power can produce voltage ripples on the power supply lines to the processor. This is significant because if the supply voltage rises or drops below a specific tolerance range, the processor may malfunction. The magnitude of these voltage ripples is affected by the instantaneous change of current with respect to time.

SUMMARY

Exemplary aspects disclosed herein include processor-based systems employing configurable local frequency throttling management to manage power demand and consumption. Related methods are also disclosed. For example, such processor-based systems may include a system-on-a-chip (SoC) that includes a processor and other power circuitry to control power provided to the processor. The processor includes a clock control circuit that is configured generate a clock signal(s) at a designated frequency to clock a processor core(s) in the processor at a desired operating frequency(ies). This processor-based system may be included on a card or blade as a printed circuit board (PCB) that is installable in an equipment rack in a data center for performing large data-intensive workloads and applications. In exemplary aspects disclosed herein, the clock control circuit is configured to dynamically throttle (i.e., limit and/or reduce) the frequency(ies) of a clock signal(s) clocking the processor in response to a frequency throttle event that may be an unexpected event. A frequency throttle event is an event that indicates that the frequency of the clock signal clocking the processor may need to be reduced and/or limited to reduce power demand and consumption. Reducing power demand may be important to ensure that the processor can continue to operate under interrupted or reduced power supply conditions that may occur. Power demand and consumption of the processor may be able to be reduced faster by throttling the operating frequency of a processor than throttling the operating voltage of power supplied to the processor. One example of such a frequency throttle event could be an internally detected thermal condition exceeding or near to exceeding a maximum temperature threshold that could degrade the processor's performance. Another example of a frequency throttle event could be an external power condition indicating a reduced availability of power that could affect the processor's ability to operate properly at its current operating frequency. If power demand is not reduced to be within the operational limits based on the available power and/or thermal requirements, the processor can be subject to "di/dt" issues that can lead to reduced performance or malfunction.

In exemplary aspects, the clock control circuit can be provided in the same integrated circuit (IC) chip and/or semiconductor die as the processor cores of the processor. The clock control circuit can be configured to directly receive notification (e.g., through an interrupt) of the frequency throttle event to reduce the frequency(ies) of a clock signal(s) clocking the processor without the additional delay of being controlled by a processor core or other processing circuit. This may be important for the processor to be able to more quickly reduce its power demand to avoid interruption in operation in response to a reduced power availability. The clock control circuit can be configured to reduce and/or limit the frequency of the generated clock signal(s) in response to the frequency throttle event according to a frequency setting that is programmed at manufacture and/or adjusted when installed. In this regard, a power control circuit can also be provided as a processor core in the processor, for example, that executes computer program code to cause the clock control circuit to adjust (i.e., increase or decrease) the frequency of the clock signal(s) based on a power budget that is not in response to a frequency throttle event. The power control circuit can also be configured to execute computer program code to set or adjust a setting of reduced frequency(ies) that the clock control circuit can access to throttle the frequency of the clock signal(s). In this manner, the reduced frequency of the clock signal can be programmed and changed as desired through the clock control circuit for flexibility and to achieve further efficiency in power consumption for finer-tuned control.

In further exemplary aspects, the voltage level of the power supplied to the processor may also be reduced after the frequency of the clock signal is reduced, to reduce power demand of the processor. The clock control circuit may also be configured to throttle the frequency of the clock signal(s) clocking the processor gradually in response to a frequency throttle event in incremental steps. For example, the clock control circuit could be configured to gradually decrease the frequency of the clock signal clocking the processor to gradually reduce the operating frequency of the processor. It may be important to gradually reduce the operating frequency of the processor over time to avoid or reduce "di/dt" issues in the processor. In this regard, in exemplary aspects, the clock control circuit could include a finite state machine (FSM) circuit that is configured to control the generation of the clock signal(s) at the desired frequency(ies) in increment steps. The clock control circuit may also include a clock generation circuit, such as a phase-locked loop (PLL) circuit for example, to generate the clock signal(s) at the desired throttled frequency and to provide feedback in a closed-loop manner when the frequency of the clock signal(s) has settled to the new, set frequency to control the hysteresis (i.e., lag) effect of the frequency of the clock signal(s) when changed. The clock control circuit can inform the power control circuit when the new frequency of the clock signal(s) is stable to then allow the processor to be clocked by the clock signal at the new frequency. Thus, in one example, the processor cores halt operations and stall until the clock signal settles at its new frequency. In another exemplary aspect, to avoid the need to stall the processor in response to a throttling of the frequency of the clock signal(s), the clock control circuit could include two (2) or multiple PLL circuits for example. A clock selection switch can be provided and controlled by the clock control circuit to alternate between selection of the clock outputs of each PLL circuit to provide the selected clock signal as the new throttled clock signal to clock the processor. In this manner, the processor can continue to operate based on a settled clock signal generated by one PLL circuit, when another PLL circuit is settling its clock signal to new reduced frequency until released to be used to clock the processor.

In this regard, in one exemplary aspect, a processor-based system is provided. The processor-based system comprises a clock control circuit configured to generate a clock signal at a current frequency on a clock output. The processor-based system also comprises a processing unit comprising at least one compute processor core each coupled the clock output each configured to execute program code at a rate based on the current frequency of the clock signal as an operating frequency. The processor-based system also comprises a throttle frequency memory configured to store a throttle frequency. The clock control circuit is configured to receive a frequency throttle signal indicating a frequency throttle event. In response to receiving the frequency throttle signal indicating the frequency throttle event, the clock control circuit is also configured to generate the clock signal at the throttle frequency lower than the current frequency, by being configured to generate the clock signal on the clock output at a next intermediate frequency between the current frequency and the throttle frequency and verify the clock signal at the next intermediate frequency. In response to verifying the clock signal at the next intermediate frequency, the clock control circuit is configured to repeat the generation of the clock signal on the clock signal at the next intermediate frequency and verify the clock signal at the next intermediate frequency steps one or more times until the next intermediate frequency is the throttle frequency.

In another exemplary aspect, a method of throttling an operating frequency of a processor in a processor-based system is provided. The method comprises generating a clock signal at a current frequency on a clock output. The method also comprises executing program code at a rate based on the current frequency of the clock signal in a processing unit comprising at least one compute processor core receiving the clock signal. The method also comprises receiving a frequency throttle signal indicating a frequency throttle event. The method also comprises, in response to receiving the frequency throttle signal indicating the frequency throttle event, generating the clock signal at a throttle frequency lower than the current frequency, by (a) generating the clock signal on the clock output at a next intermediate frequency between the current frequency and the throttle frequency, and (b) verifying the clock signal at the next intermediate frequency. The method also comprises, in response to verifying the clock signal at the next intermediate frequency, repeating steps (a)-(b) one or more times until the next intermediate frequency is the throttle frequency.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 9 is an exemplary voltage-frequency table that can be stored in the processor in FIG. 2 and accessible by the power control circuit therein to determine a new operating voltage and corresponding operating frequency as a voltage-frequency pair for controlling power demand of the processor-based system;

Figure 2:
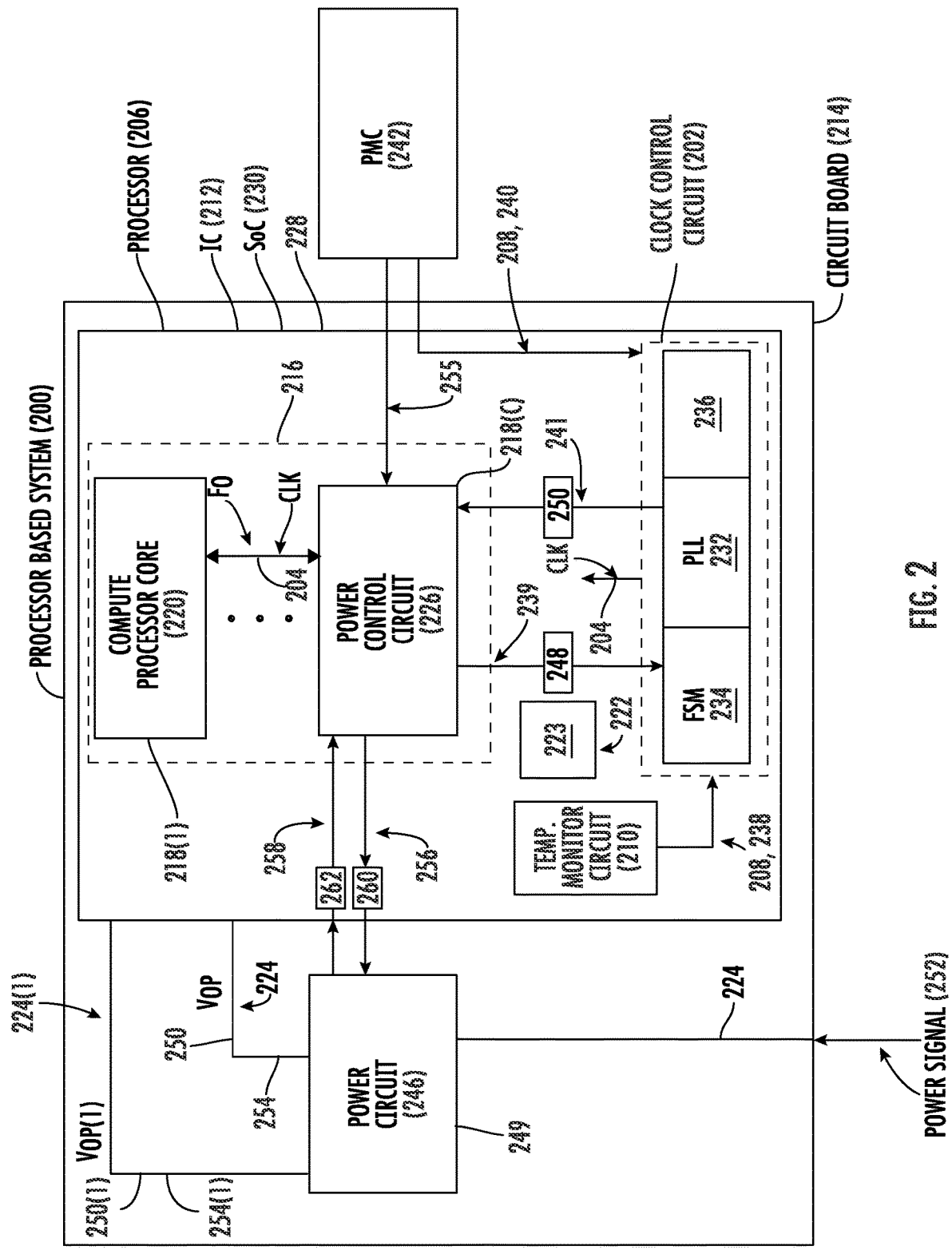
FIG. 2 is a block diagram of an exemplary processor-based system that includes a clock control circuit configured to locally throttle the frequency(ies) of a clock signal(s) clocking a processor to throttle the operating frequency(ies) of the processor, in response to a frequency throttle event, to throttle the power demand of the processor.
Figure 10:
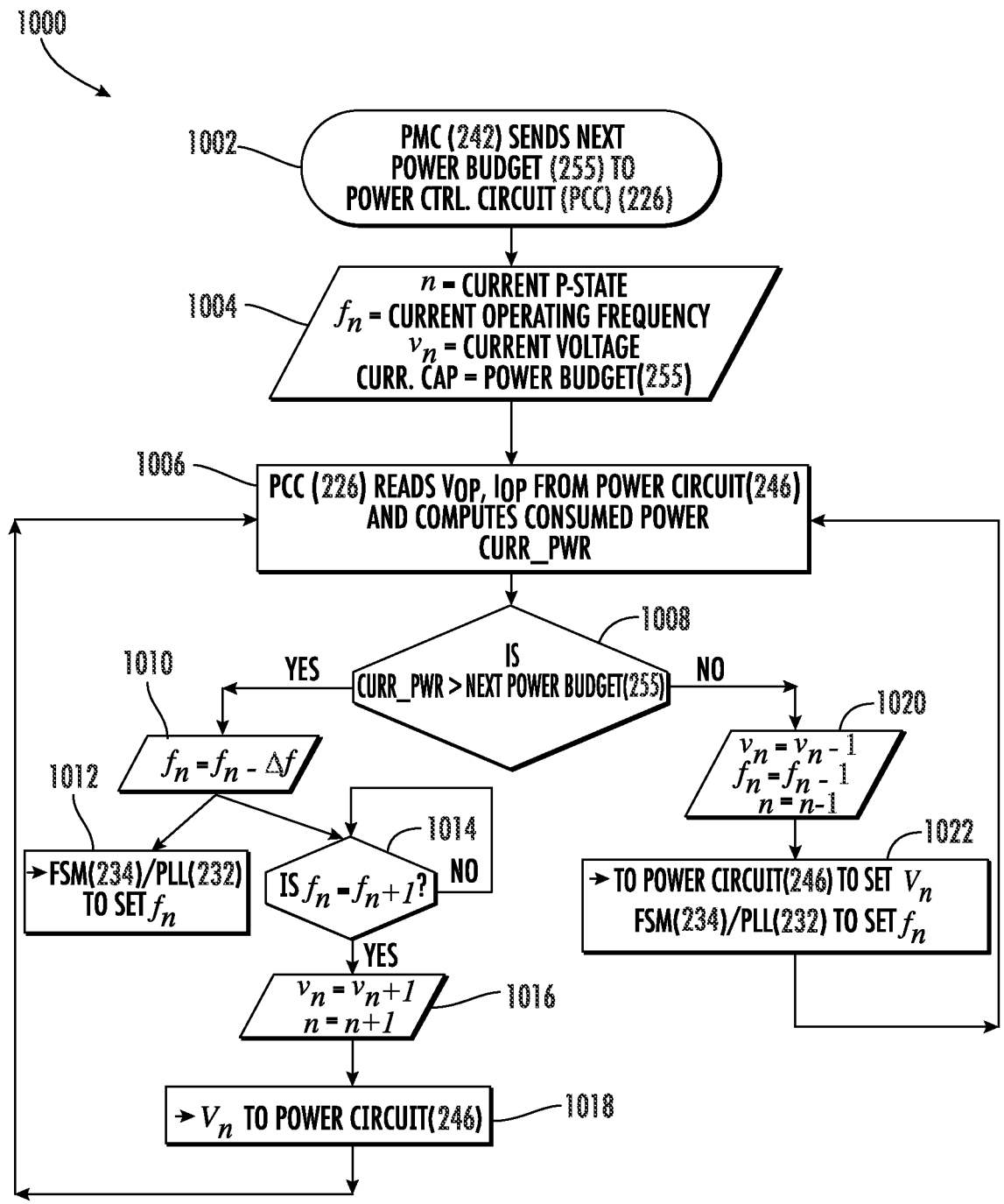
Figure 11:
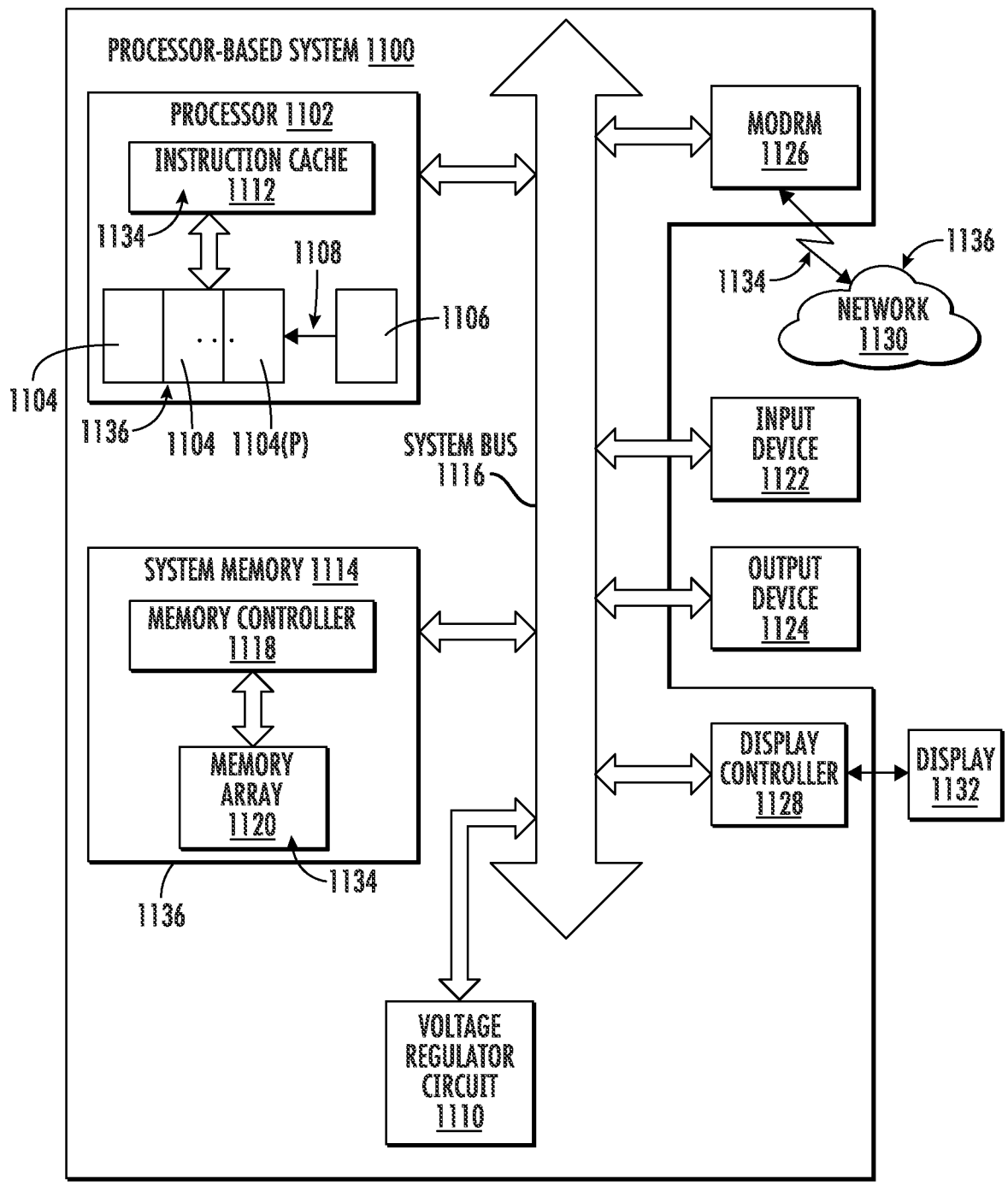

FIG. 10 is a flowchart illustrating a more detailed exemplary process of the power control circuit in the processor-based system in FIG. 2 monitoring power demand of the processor-based system and locally managing power demand by dynamically adjusting operating frequency and/or operating voltage of power supplied to the processor-based system within an established power budget; and FIG. 11 is a block diagram of an exemplary processor-based system that includes a processor with one or more processor cores each configured to execute computer instructions for execution, wherein the processor-based system further includes a clock control circuit configured to locally throttle the frequency(ies) of a clock signal(s) clocking a processor to throttle the operating frequency(ies) of the processor, in response to a frequency throttle event, to throttle the power demand of the processor, including, without limitation, the processor-based system in FIGS. 2, 3, 6, and 8.

DETAILED DESCRIPTION

Exemplary aspects disclosed herein include processor-based systems employing configurable local frequency throttling management to manage power demand and consumption. Related methods are also disclosed. For example, such processor-based systems may include a system-on-a-chip (SoC) that includes a processor and other power circuitry to control power provided to the processor. The processor includes a clock control circuit that is configured generate a clock signal(s) at a designated frequency to clock a processor core(s) in the processor at a desired operating frequency(ies). This processor-based system may be included on a card or blade as a printed circuit board (PCB) that is installable in an equipment rack in a data center for performing large data-intensive workloads and applications. In exemplary aspects disclosed herein, the clock control circuit is configured to dynamically throttle (i.e., limit and/or reduce) the frequency(ies) of a clock signal(s) clocking the processor in response to a frequency throttle event that may be an unexpected event. A frequency throttle event is an event that indicates that the frequency of the clock signal clocking the processor may need to be reduced and/or limited to reduce power demand and consumption. Reducing power demand may be important to ensure that the processor can continue to operate under interrupted or reduced power supply conditions that may occur. Power demand and consumption of the processor may be able to be reduced faster by throttling the operating frequency of a processor than throttling the operating voltage of power supplied to the processor. One example of such a frequency throttle event could be an internally detected thermal condition exceeding or near to exceeding a maximum temperature threshold that could degrade the processor's performance. Another example of a frequency throttle event could be an external power condition indicating a reduced availability of power that could affect the processor's ability to operate properly at its current operating frequency. If power demand is not reduced to be within the operational limits based on the available power and/or thermal requirements, the processor can be subject to "di/dt" issues that can lead to reduced performance or malfunction.

In exemplary aspects, the clock control circuit can be provided in the same integrated circuit (IC) chip and/or semiconductor die as the processor cores of the processor. The clock control circuit can be configured to directly receive notification (e.g., through an interrupt) of the frequency throttle event to reduce the frequency(ies) of a clock signal(s) clocking the processor without the additional delay of being controlled by a processor core or other processing circuit. This may be important for the processor to be able to more quickly reduce its power demand to avoid interruption in operation in response to a reduced power availability. The clock control circuit can be configured to reduce and/or limit the frequency of the generated clock signal(s) in response to the frequency throttle event according to a frequency setting that is programmed at manufacture and/or adjusted when installed. In this regard, a power control circuit can also be provided as a processor core in the processor, for example, that executes computer program code to cause the clock control circuit to adjust (i.e., increase or decrease) the frequency of the clock signal(s) based on a power budget that is not in response to a frequency throttle event. The power control circuit can also be configured to execute computer program code to set or adjust a setting of reduced frequency(ies) that the clock control circuit can access to throttle the frequency of the clock signal(s). In this manner, the reduced frequency of the clock signal can be programmed and changed as desired through the clock control circuit for flexibility and to achieve further efficiency in power consumption for finer-tuned control.

In this regard, FIG. 2 is a block diagram of an exemplary processor-based system 200. The processor-based system 200 includes a clock control circuit 202. As discussed in more detail below, the clock control circuit 202 is configured to dynamically throttle (i.e., limit and/or reduce) the frequency(ies) of a generated clock signal(s) CLK on a clock output 204 clocking a processor 206 in response to a frequency throttle event that may be an unexpected event. A frequency throttle event 208 is an event that indicates that the frequency of the clock signal CLK clocking the processor 206 may need to be throttled (i.e., reduced and/or limited in frequency) to reduce power demand and consumption of the processor 206. Reducing power demand of the processor 206 in the processor-based system 200 may be important to ensure that the processor 206 can continue to operate under interrupted or reduced power supply conditions that may occur. Power demand and consumption of the processor 206 may be able to be reduced faster by throttling the operating frequency of the processor 206 than throttling the operating voltage of power supplied to the processor 206. As discussed in more detail below, one example of such a frequency throttle event 208 could be an internally detected thermal condition by a temperature monitor circuit 210 that could degrade the processor's 206 performance. Another example of a frequency throttle event 208 could be external power condition indicating a reduced availability of power that could affect the processor's 206 ability to operate properly at its current operating frequency.

If power demand is not reduced to be within the operational limits based on the available power and/or thermal requirements, the processor can be subject to "di/dt" issues that can lead to reduced performance or malfunction. A "di/dt" issue is a current variation caused by a sudden change in power that produces voltage ripples on power supply lines to the processor 206. The magnitude of these voltage ripples is affected by the instantaneous change of current (di) with respect to time (dt). When there is such a sudden reduction in power made available to the processor 206, this can cause brown-out conditions for the processor 206 leading to an interruption in operation or malfunction.

Figure 1A:
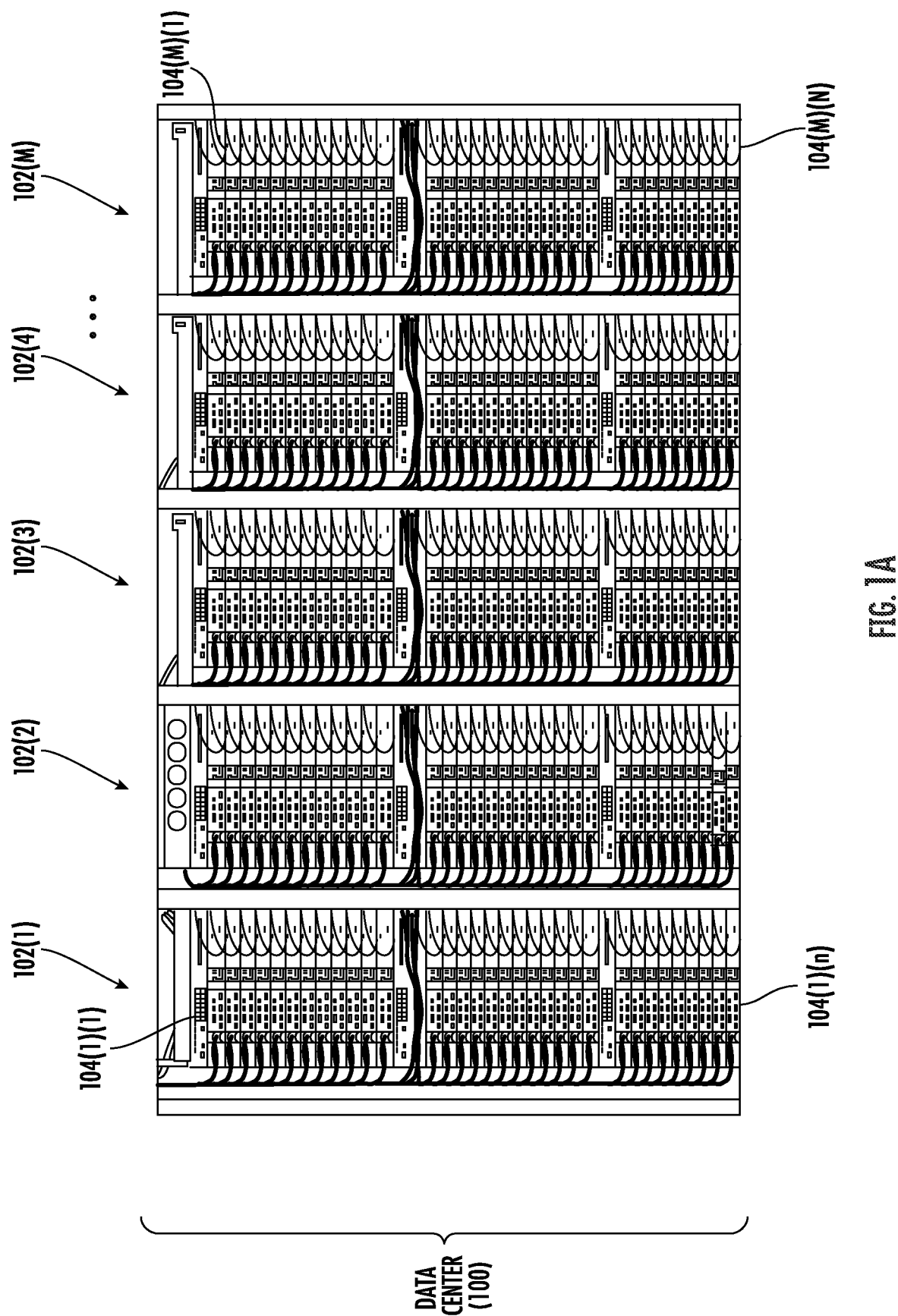
FIG. 1A is diagram of an exemplary data center that includes server racks that include computer systems that each include a processor-based system on a circuit board.
Figure 1B:
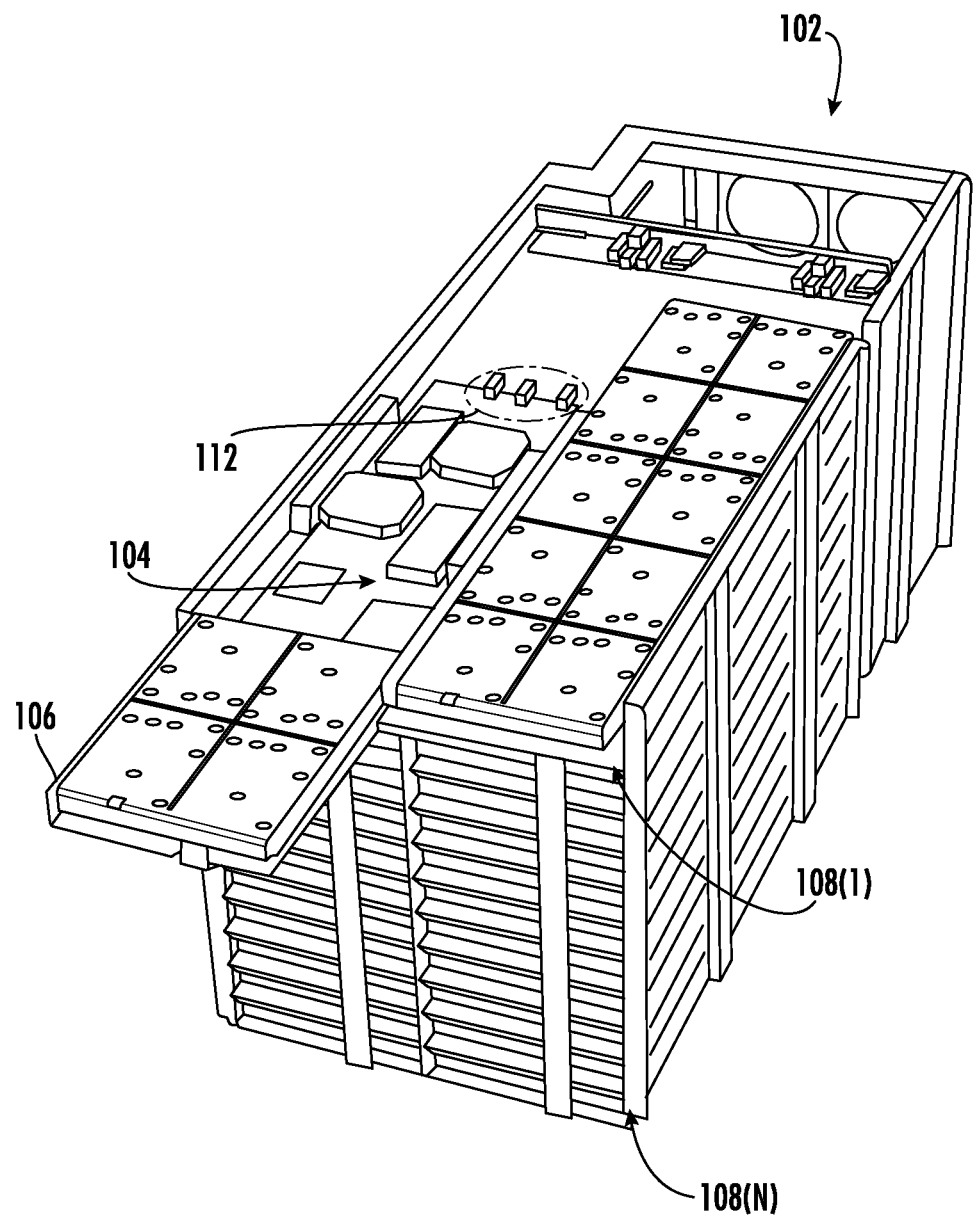
FIG. 1B is a more detailed diagram of an exemplary computer system installed in a server rack that includes a processor-based system mounted on a circuit board and interfaced to a signal and power backplane for external communications and power supply.

With reference to FIG. 2, the processor-based system 200 may be deployed as a board or blade installed in a server or equipment rack in a data center, for example, such as the data center 100 in FIGS. 1A and 1B. In FIG. 2, the processor-based system 200 includes a processor 206 that is provided in the form of an integrated circuit (IC) 212 that is mounted to a circuit board 214, such as a printed-circuit board (PCB). The exemplary components of the processor-based system 200 will now be described. This is followed starting at FIG. 3 by a discussion of exemplary operational aspects of the clock control circuit 202 throttling the operating frequency of the clock signal CLK supplied to the processor-based system 200 in response to a frequency throttle event 208 to control power demand and consumption of the processor 206.

With reference to FIG. 2, the processor 206 of the processor-based system 200 includes a processing unit 216 (e.g., a central processing unit (CPU) or general processing unit (GPU)) that can include one or more processor cores 218(1)-218(C). The processor cores 218(1)-218(C) are configured to execute computer program code at a rate of an operating frequency according to the frequency $F_O$ of the clock signal CLK generated by the clock control circuit 202 on the clock output 204. For example, the processor core 218(1) is shown as a compute processor core 220 that is configured to execute computer program code 222 ("program code 222") in a memory 223 to perform computations for an application. In this example, as discussed in more detail starting at FIG. 10, one of the processor cores 218(1)-218(C), the processor core 218(C) is a power control circuit 226, can also be configured to dynamically adjust the operating frequency and/or operating voltage of a power signal 224 supplied to the processor-based system 200 within an established power budget. The processing unit 216 and memory 223 can be integrated into a single IC chip 228 as a system-on-a-chip (SoC) 230 as an example. The clock control circuit 202 is included on the same IC chip 228 as the processing unit 216. This can provide greater flexibility for the clock control circuit 202 to receive and provide information in the processor 206, such as through interrupts and registers, for throttling the frequency $F_O$ of the clock signal CLK in response to a frequency throttle event 208.

With continuing reference to FIG. 2, the processor 206 also includes the clock control circuit 202 configured to generate the clock signal CLK at a set frequency $F_O$ to clock the processor 206. For example, the clock control circuit 202 may include a phase-locked loop (PLL) circuit 232 that is configured to adjust the frequency $F_O$ of the clock signal CLK in a closed-loop feedback manner. The clock control circuit 202 is configured to throttle the frequency $F_O$ of the clock signal CLK based on a frequency throttle event 208. In the example processor 206 in FIG. 2, as discussed in more detail below, the clock control circuit 202 includes a finite state machine (FSM) circuit 234. The FSM circuit 234 is configured to control the generation of the clock signal CLK by the PLL circuit 232 at the desired operating frequency, which may be a throttled frequency or other operating frequency as controlled by the power control circuit 226, as discussed in more detail below. The clock control circuit 202 in this example includes frequency step circuits 236 that are configured to step up or step down the operating frequency $F_O$ the clock signal CLK in increments. This allows the operating frequency $F_O$ the clock signal CLK to settle to a new operating frequency over time to control the hysteresis (i.e., lag) effect of the operating frequency $F_O$ of the clock signal CLK when changed. This can be done as opposed to drastically changing the operating frequency $F_O$ of the clock signal CLK to a new operating frequency in a single action or step.

The clock control circuit 202 is configured to receive a frequency throttle event 208 indicating that the frequency $F_O$ of the clock signal CLK is to be throttled. For example, the frequency throttle event 208 could be in the form of an interrupt that is generated and communicated to the processor 206 and the clock control circuit 202. The temperature monitor circuit 210 is configured to generate a frequency throttle signal 238 indicating a frequency throttle event 208 in response to the detected ambient temperature exceeding a defined threshold temperature. As an example, the frequency throttle event 208 could be generated in a frequency throttle signal 240 by an external device, such as a power management circuit (PMC) 242, that is configured to cause the clock control circuit 202 to throttle the frequency $F_O$ of the clock signal CLK. As another example, the frequency throttle event 208 could be generated by the temperature monitor circuit 210 as a result of a measured temperature exceeding or approaching a defined threshold temperature that could cause the processor 206 to reduce performance and/or malfunction in an undesired manner. If the measured temperature is only approaching a defined threshold temperature without exceeding the defined threshold temperature, the clock control circuit 202 may be configured to reduce and self-throttle the frequency $F_O$ of the clock signal CLK to reduce the power demand of the processor 206 to reduce temperature with continued operation. However, if the measured temperature exceeds the defined threshold temperature, the clock control circuit 202 may be configured to shut down operation of the processor 206 by reducing the frequency $F_O$ of the clock signal CLK in steps until a throttle frequency is reached to then shut down and reset the processor 206. The temperature monitor circuit 210 may be located in the IC chip 228 and/or proximate to the IC chip 228 to be able to detect an ambient temperature of the processor 206.

Figure 3:
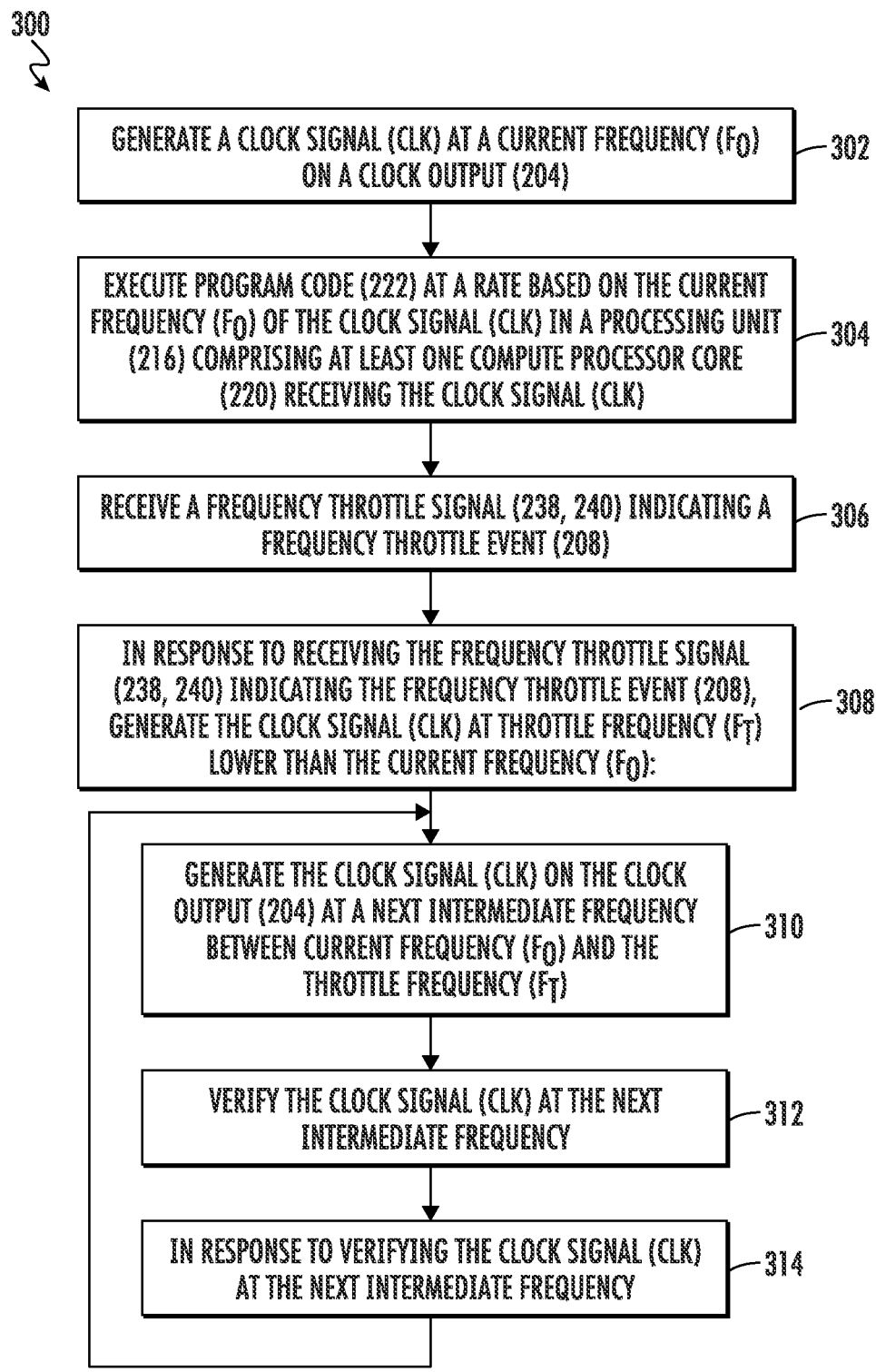
FIG. 3 is a flowchart illustrating an exemplary process of the processor-based system in FIG. 2 self-throttling the operating frequency(ies) of the processor, in response to a self-throttle, frequency throttle event, to throttle the power demand of the processor.

In this example, the clock control circuit 202 is configured to generate the clock signal CLK at a current frequency $F_O$ on the clock output 204 to clock the processor 206 (block 302 in FIG. 3). The processor 206 is configured to execute program code 222 at a rate based on the current frequency $F_O$ of the clock signal CLK in a processing unit 216 comprising at least one compute processor core 220 receiving the clock signal CLK (block 304 in FIG. 3). The clock control circuit 202 is configured to receive a frequency throttle signal 238, 240 indicating the frequency throttle event 208 to be able to react quickly to an instruction to throttle the frequency $F_O$ of the clock signal CLK (block 306 in FIG. 3). In response to receiving the frequency throttle signal 238, 240 indicating the frequency throttle event 208, the clock control circuit 202 is configured to generate the clock signal CLK at a throttle frequency $F_T$ lower than the current frequency $F_O$ of the clock signal CLK (block 308 in FIG. 3). For example, the throttle frequency $F_T$ may be a programmed and/or pre-configured frequency that is stored in a throttle frequency memory, such as memory 223, to be accessible by the clock control circuit 202 for setting the frequency $F_O$ of the clock signal CLK. The clock control circuit 202 is configured to generate the clock signal CLK on the clock output 204 at a next intermediate frequency $F_O$ between the current frequency $F_O$ and the throttle frequency $F_T$ (block 310 in FIG. 3). This is so that the frequency $F_O$ of the clock signal CLK is eventually set to the throttle frequency $F_T$ in a number of frequency steps to avoid a drastic change in the frequency $F_O$ that could cause a di/dt event in the processor 206. In this example, the FSM circuit 234 is configured to cause the PLL circuit 232 to generate the clock signal CLK on the clock output 204 at the next intermediate frequency $F_O$. The clock control circuit 202, and more particularly, the FSM circuit 234 in this example, is configured to then verify that the frequency $F_O$ of the clock signal CLK has settled to the next intermediate frequency $F_O$ (block 312 in FIG. 3). In response to verifying the clock signal CLK at the next intermediate frequency $F_O$, the clock control circuit 202 is configured to continue to generate and verify the clock signal CLK at the next intermediate frequencies $F_O$, until the next intermediate frequency $F_O$ is or is approximately at the throttle frequency $F_T$ (blocks 314, 310, and 312 in FIG. 3).

In this example, the FSM circuit 234 can be configured to go up and down power states to increase and decrease the frequency $F_O$ of the clock signal CLK in response to a frequency throttle event 208. The FSM circuit 234 controls the PLL circuit 232 to generate the clock signal CLK at the next operating frequency. The FSM circuit 234 may be programmed to cause the PLL circuit 232 to generate the clock signal CLK at a next operating frequency in incremental steps after a next incremental change in the frequency $F_O$ of the clock signal CLK is verified in a closed-loop manner. The FSM circuit 234 may be configured to instruct the PLL circuit 232 to change the frequency $F_O$ of the clock signal CLK according to a proportional-integral-derivative (PID) algorithm, where the frequency $F_O$ of the clock signal CLK, a rate of change of the frequency $F_O$ of the clock signal CLK, and/or an integration of a previous history of frequencies $F_O$ of the clock signal CLK are used to determine the next incremental frequency $F_O$ for the clock signal CLK. For example, previous set operating frequencies $F_O$ of the clock signal CLK may be stored by the FSM circuit 234 in the clock control circuit 202. The clock control circuit 202 can be configured to cause the frequency $F_O$ of the clock signal CLK to be adjusted iteratively until the frequency $F_O$ of the clock signal CLK reaches the desired next operating frequency, which may be the throttle frequency, or other frequency set by the power control circuit 226. In this example, the clock control circuit 202 can inform the power control circuit 226 when the new frequency $F_O$ of the clock signal CLK is stable to then allow the processor 206 to be clocked by the clock signal CLK at the new frequency. The processor 206 could halt all operations and stall the processor cores 218(1)-218(C) until the clock signal CLK settles at its new frequency $F_O$.

Figure 4:
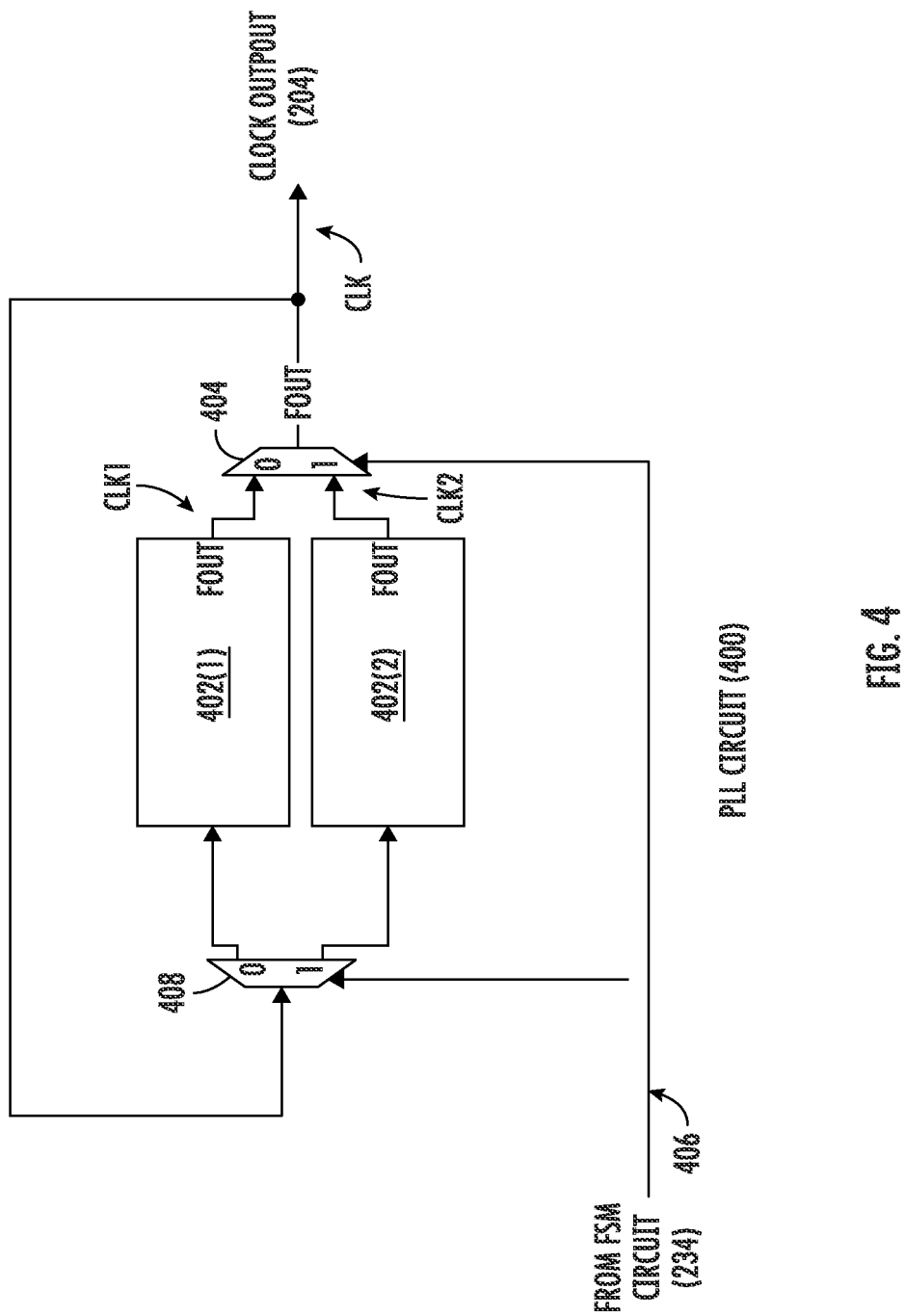
FIG. 4 is a block diagram of an exemplary phase-locked-loop (PLL) system that can be employed in the clock control circuit in the processor-based system in FIG. 2, and configured to select a clock signal generated by one of a plurality of PLL circuits to be used to clock the processor.

In another exemplary aspect, to avoid the need to stall the processor 206 in response to a throttling of the frequency $F_O$ of the clock signal CLK, the clock control circuit 202 could include two (2) or multiple PLL circuits 232, for example. This is shown by an example PLL circuit 400 in FIG. 4, which could be the PLL circuit 232 in the clock control circuit 202 in FIG. 2. As shown therein, the PLL circuit 400 includes a first PLL circuit 402(1) and a second PLL circuit 402(2). Each PLL circuit 402(1), 402(2) is configured to generate respective clock signals CLK1, CLK2 at respective first and second frequencies in a closed-loop manner A clock selection circuit 404 is provided in the PLL circuit 400 to pass one of the two (2) clock signals CLK1, CLK2 generated by the respective PLL circuits 402(1), 402(2) based on a clock selection signal 406 that is provided by the FSM circuit 234 in FIG. 2 in this example. The clock selection circuit 404 is a multiplexor circuit in this example. The PLL circuit 400 also includes a clock feedback selection switch 408 that controls which clock signal between clock signals CLK1, CLK2 on the clock output 204 are fed back to the respective PLL circuits 402(1), 402(2) based on the clock selection signal 406. The FSM circuit 234 is configured to control the clock selection signal 406 to alternate selection between passing either the first or second clock signal CLK1, CLK2 on the clock output 204 as the clock signal CLK to clock the processor 206 in FIG. 2. The FSM circuit 234 controls the clock selection signal 406 selecting between the first and second clock signals CLK1, CLK2 on the clock output 204 based on selecting the PLL circuit 402(1), 402(2) that generated the previously-settled clock signal, while the other PLL circuit 402(2), 402(1) is in the process of generating a settled clock signal CLK2, CLK1. In this manner, the processor 206 can continue to operate based on a settled clock signal CLK2, CLK1 as the clock signal CLK generated by one of the PLL circuits 402(1), 402(2), while the other PLL circuit 402(2), 402(1) is settling its clock signal CLK2, CLK1 to a new reduced frequency to then be able to be used to clock the processor 206. The FSM circuit 234 can continue to alternatively select between the first and second PLL circuits 402(1), 402(2) to generate the clock signal CLK until the clock signal CLK reaches the final throttled frequency $F_T$.

As discussed above, the clock control circuit 202 in the processor 206 of the processor-based system 200 in FIG. 2 is configured to throttle the frequency $F_O$ of the clock signal CLK in response to a frequency throttle event 208. Non-limiting examples of frequency throttle events that can occur in processor-based systems wherein a clock control circuit therein can throttle the frequency of a clock signal clocking a processor in response, will now be described with regard to FIGS. 5-7.

Figure 5:
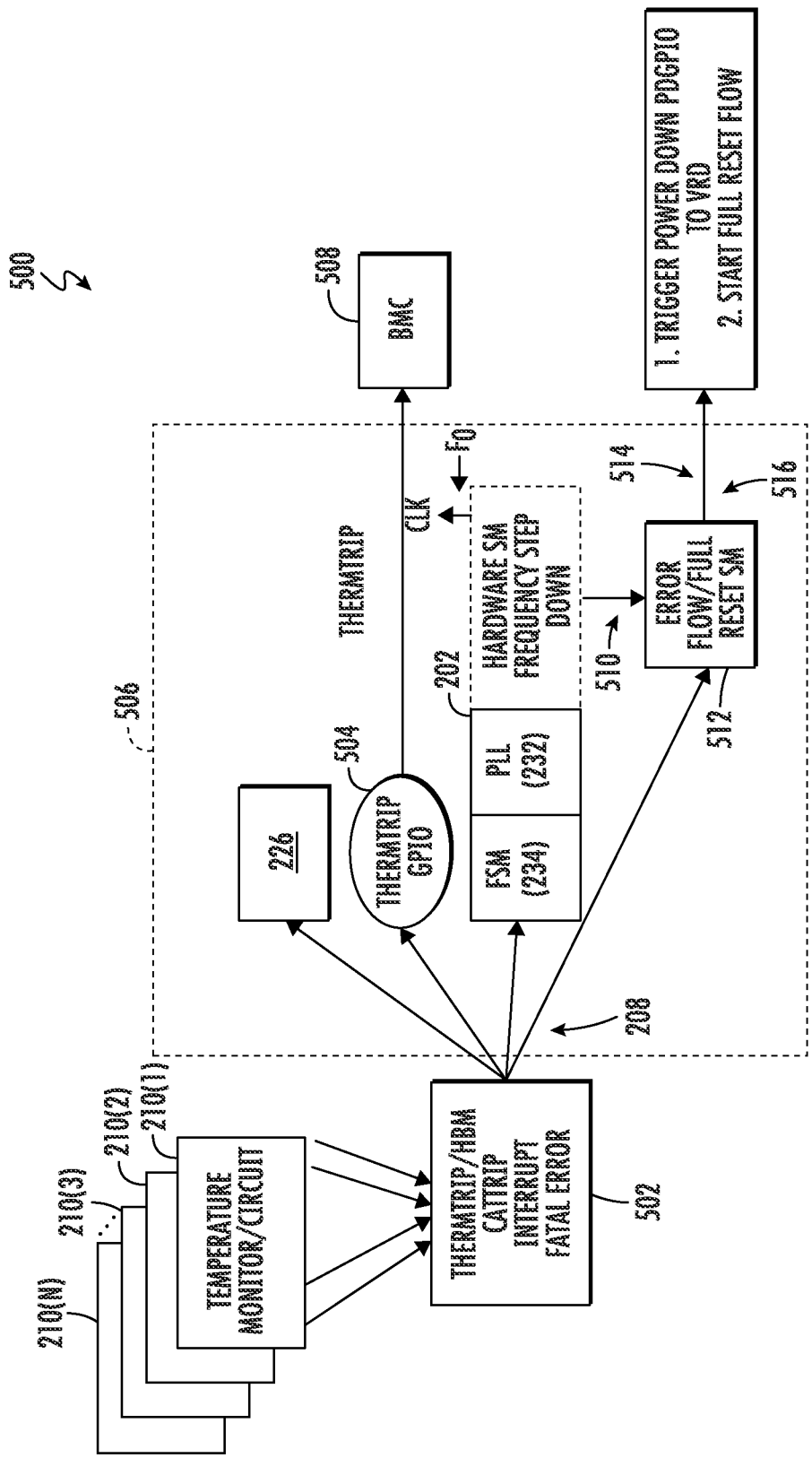
FIG. 5 is an exemplary communication flow for a thermal shutdown frequency throttle event in the processor-based system in FIG. 2.

In this regard, FIG. 5 is an exemplary communication flow for a thermal frequency throttle event in the processor-based system 500 that can be the processor-based system 200 in FIG. 2. An example of a thermal frequency throttle event is where the ambient temperature in the processor-based system 500 and a processor therein reaches a defined temperature limit such that the processor needs to be shut down to cool down, but it is desired for the operating frequency of the clock signal clocking the processor to first be throttled down in frequency to allow the processor to continue to operate under reduced power demand to then be shut down. Common elements between the processor-based system 500 in FIG. 5 and the processor-based system 200 in FIG. 2 are shown with common element numbers.

As shown in FIG. 5, the processor-based system 500 may include one or more temperature monitor circuits 210(1)-210(N) that are each configured to detect temperature in the processor-based system 500. The temperature monitor circuits 210(1)-210(N) can be included in a processor 506 and/or provided on the same semiconductor die and/or in the same IC chip as the processor 506. More than one temperature monitor circuit 210(1)-210(N) may be employed to measure the temperature in different areas of the processor-based system 500 and/or its processor 506. If a temperature monitor circuit 210(1)-210(N) reaches a maximum allowed temperature, which may be programmable for example, such temperature monitor circuit 210(1)-210(N) is configured to generate a thermal shutdown interrupt 502 as a frequency throttle event 208 in this example. This means that the temperature at or surrounding the processor 506 is beyond the operating capabilities or specifications of the processor 506 for operation without malfunction. Thus, it may be desired to shut down the processor 506 to allow it to cool down and then be reset for continued operation.

In this regard, the frequency throttle event 208 is communicated to the power control circuit 226 as a processor core 218 and the clock control circuit 202. The frequency throttle event 208 is also communicated to a thermal trip pin 504 that is then communicated to a board management circuit (BMC) 508 in the processor-based system 500 to be communicated to other systems or off board of the processor-based system 500. In response to receiving the frequency throttle event 208 indicating a thermal shutdown, the clock control circuit 202 is configured to start throttling and reducing the frequency $F_O$ of the clock signal CLK in increments or steps until reaching a programmed or configured throttle frequency $F_T$ for a thermal shutdown event as previously described. The FSM circuit 234 in the clock control circuit 202 is configured to send a frequency throttle completion signal 510 when the throttle frequency $F_T$ is reached. An error flow circuit 512 will then initiate a reset of the processor 506 by communicating a reset signal 514. In one option, the error flow circuit 512 can also communicate a power down signal 516 to a power circuit (discussed in more detail below with regard to FIG. 2) to shut down and reset generation of power to power the processor 506.

It may also be desired to throttle the frequency of the clock signal clocking a processor in a processor-based system if the temperature of or surrounding the processor exceeds a desired temperature threshold even if such temperature threshold is not high enough to warrant a complete shutdown. The frequency of the clock signal can be self-throttled to maintain the processor within a desired temperature. This can allow the clock signal to be throttled to reduce the power demand and consumption by the processor to prevent the temperature from exceeding a temperature that would warrant a shutdown and reset.

Figure 6:
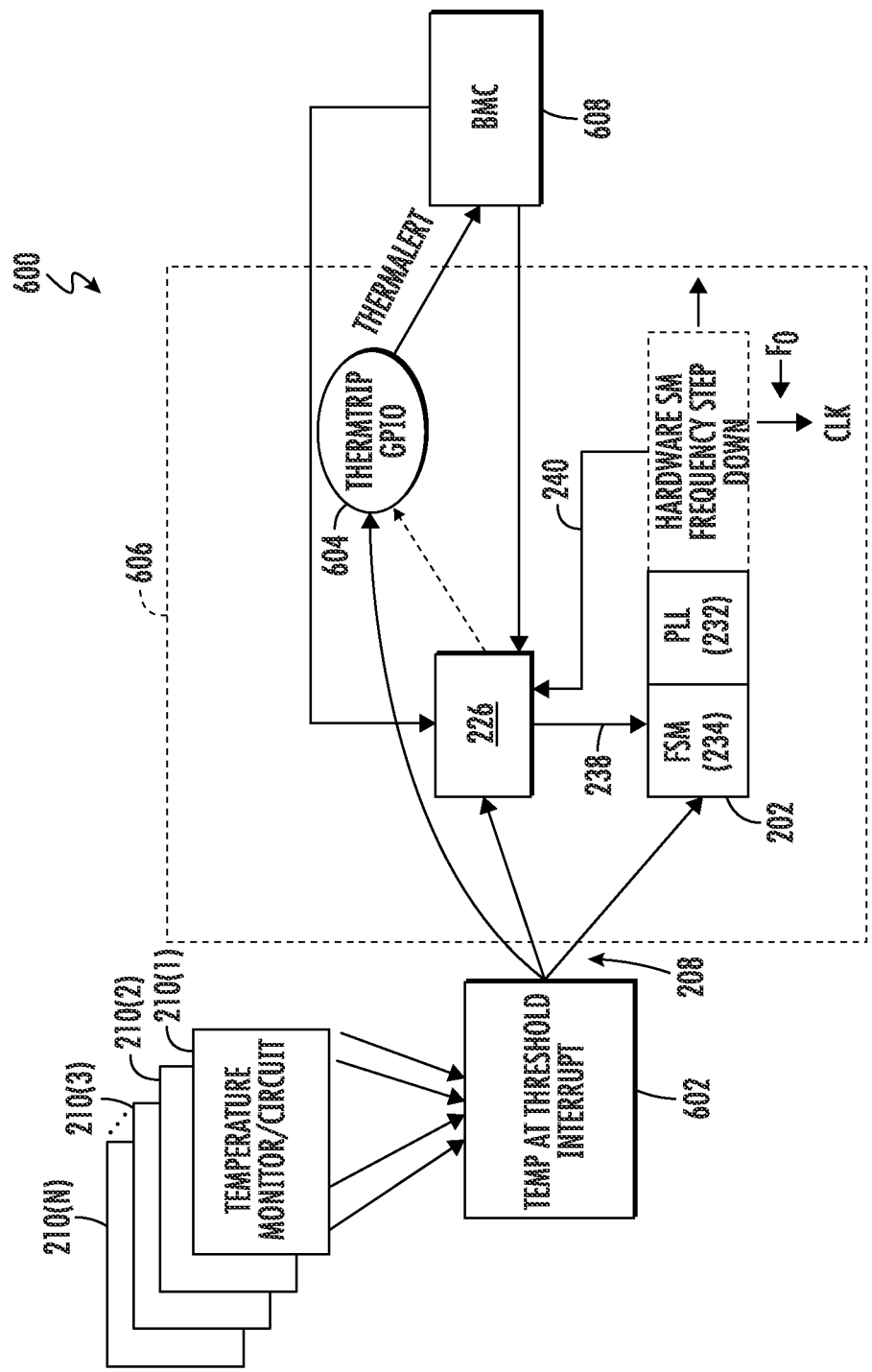
FIG. 6 is an exemplary communication flow for a self-throttle frequency throttle event in the processor-based system in FIG. 2.

In this regard, FIG. 6 is an exemplary communication flow for a self-throttle frequency throttle event 208 in a processor-based system 600 that can be the processor-based system 200 in FIG. 2. An example of a self-throttle frequency throttle event is where the ambient temperature in the processor-based system 600 and a processor therein reaches a defined temperature limit such that the processor can still operate, but the temperature should ideally be reduced through a reduced operating speed and thus reduced power demand to allow the temperature of the processor to be maintained within a desired temperature limit. Common elements between the processor-based system 600 in FIG. 6 and the processor-based system 200 in FIG. 2 are shown with common element numbers.

As shown in FIG. 6, the processor-based system 600 may include one or more temperature monitor circuits 210(1)-210(N) that are each configured to detect temperature in the processor-based system 600. The temperature monitor circuits 210(1)-210(N) can be included in a processor 606 and/or provided on the same semiconductor die and/or in the same IC chip as the processor 606. More than one temperature monitor circuit 210(1)-210(N) may be employed to measure the temperature in different areas of the processor-based system 600 and/or its processor 606. If a temperature monitor circuit 210(1)-210(N) exceeds a defined temperature limit in which the power demand of the processor 606 should be reduced to avoid exceeding a maximum temperature limit for shutdown, which may be programmable for example, such temperature monitor circuit 210(1)-210(N) is configured to generate a self-throttle interrupt 602 as a frequency throttle event 208 in this example. This means that the temperature at or surrounding the processor 606 is beyond the desired limit for continued operation at the current frequency $F_O$ of the clock signal CLK. Thus, it may be desired to throttle the frequency $F_O$ of the clock signal CLK clocking the processor 606 to reduce its power demand to allow it to cool down for continued operation.

In this regard, the frequency throttle event 208 is communicated to the power control circuit 226 as a processor core 218 and the clock control circuit 202. The frequency throttle event 208 is also communicated to a thermal trip pin 604 that is then communicated to a BMC 608 in the processor-based system 600 to be communicated to other systems or off board of the processor-based system 600. In response to receiving the frequency throttle event 208 and in parallel to the frequency throttle event 208 being communicated to the thermal trip pin 604, indicating a self-throttle frequency throttle event, the clock control circuit 202 is configured to start throttling and reducing the frequency $F_O$ of the clock signal CLK in increments or steps until reaching a programmed or configured throttle frequency $F_T$ for a thermal shutdown event as previously described. The FSM circuit 234 in the clock control circuit 202 is configured to send a frequency throttle completion signal 610 when the throttle frequency $F_T$ is reached. The BMC 608 can obtain temperature information from the temperature monitor circuits 210(1)-210(N) to determine when the temperature is below a desired temperature threshold such that the processor 606 can be allowed to continue to operate in a normal manner. The power control circuit 226 can then regulate the frequency and/or the operating voltage of the processor-based system 600, as discussed by example starting at FIG. 8, below.

It may also be desired to allow an external device to a processor-based system to initiate a throttling of the frequency of the clock signal clocking a processor in a processor-based system as a method of controlling power demand and consumption. For example, the processor-based system may be provided in a data center along with a number of other processor-based systems. The data center may have a power management system that is designed to regulate and control power distribution to the processor-based system based on a variety of conditions and factors.

Figure 7:
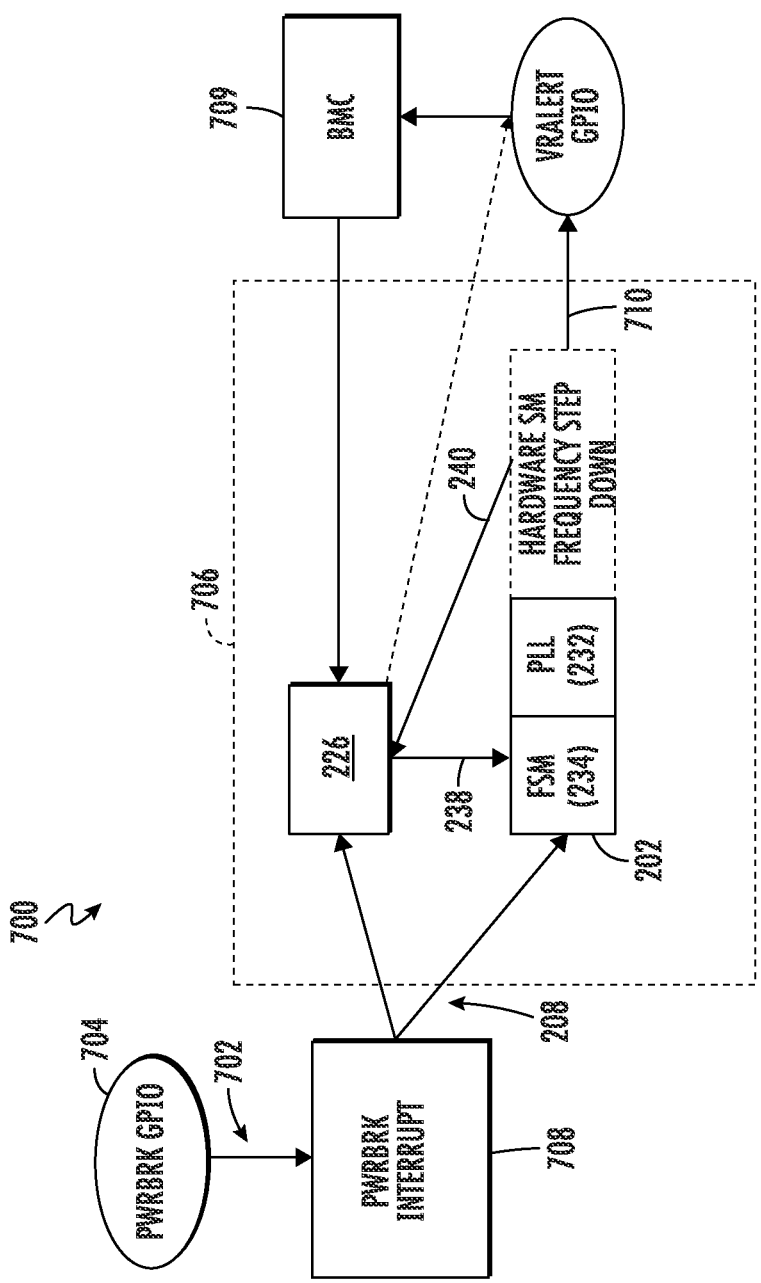
FIG. 7 is an exemplary communication flow for an external frequency throttle event in the processor-based system in FIG. 2.

In this regard, FIG. 7 is an exemplary communication flow for an external frequency throttle event 208 in a processor-based system 700 that can be the processor-based system 200 in FIG. 2. Common elements between the processor-based system 700 in FIG. 7 and the processor-based system 200 in FIG. 2 are shown with common element numbers.

As shown in FIG. 7, the processor-based system 700 includes an external communication pin 704 that is configured to receive an external signal from an external device. The external device could be external to a processor 706 and still a part of the processor-based system 700, or external to the processor-based system 700. The external communication pin 704 can be configured to receive a frequency throttle signal 702 that can trigger a frequency throttle interrupt 708. The frequency throttle interrupt 708 can trigger an external frequency throttle event 208 that is communicated to the power control circuit 226 and the clock control circuit 202. In response to receiving the frequency throttle event 208, the clock control circuit 202 is configured to start throttling and reducing the frequency $F_O$ of the clock signal CLK in increments or steps until reaching a programmed or configured throttle frequency $F_T$ for a thermal shutdown event as previously described. The FSM circuit 234 in the clock control circuit 202 is configured to send a frequency throttle completion signal 710 when the throttle frequency $F_T$ is reached. The frequency throttle completion signal 710 is communicated to a BMC 709 to release the processor 706 into normal operation. The power control circuit 226 can also then regulate the frequency and/or the operating voltage of the processor-based system 700, as discussed by example starting at FIG. 8, below.

It may also be important to control the operating voltage provided to power the processor-based system 200 and its processor 206 in FIG. 2 to throttle its power demand and power consumption. For example, if the processor-based system 200 is deployed in a data center, it may be important to manage the overall power consumption in the data center. However, particularly with artificial intelligence (AI) applications as an example, the workloads assigned to the processor-based system 200 may more greatly vary. And not all processor-based systems in the data center may need the same amount of power to process a given workload at an operating frequency to achieve a desired performance. Some processor-based systems may be executing less intense workloads that can be executed at lower operating frequencies, and thus a lower performance level, under its power budget. Other processor-based systems may be executing workloads that would require additional power outside of its power budget to operate at a higher operating frequency to perform at the desired performance. In addition, there can be sudden changes in the data center power availability, such as uninterruptable power supply (UPS) changes, that can impact power distribution to the processor-based systems and thus the CPU performance in the processor-based systems. These issues can impact the performance level of applications executed by the processor-based systems, such as processor-based system 200, in the data center. This can then impact user experiences of such applications. Thus, in data centers, power is becoming one of the chief drivers of total cost of ownership.

In this regard, with reference back to FIG. 2, the processor-based system 200 includes a power circuit 246, which may be a voltage regulator circuit for example. The power circuit 246 may be provided as a separate IC chip 249 from the IC chip 228 that contains the processor 206. The power circuit 246 is coupled to a power rail 250 that receives a power signal 252 to provide power to the processor-based system 200. The power circuit 246 is configured to set an operating voltage $V_{OP}$ on a power signal 252 on a power output 254 of a power rail 250 provided to the processor 206 for operation. The power circuit 246 sets the operating voltage $V_{OP}$ of the power signal 252 based on a power budget established for the processor-based system 200. The power control circuit 226 of the processor 206 receives a power budget 255 from the PMC 242 that is a separate system from the processor-based system 200 in this example. For example, the PMC 242 may be provided as a centralized system in a data center that provides power budgets to a number of processor-based systems 200, like the processor-based system 200 in FIG. 2, to manage the overall power consumption in a data center.

As discussed in more detail below, the power control circuit 226 determines an operating voltage for the processor-based system 200 based on the received power budget 255. The power control circuit 226 then communicates an operating voltage indicator 256 indicating an operating voltage level to the power circuit 246. In response, the power circuit 246 provides the power signal 224 of an operating voltage $V_{OP}$ at the operating voltage level indicated by operating voltage indicator 256 to the processor-based system 200 and its processor 206 for operation. The power circuit 246 can provide an operating voltage feedback indicator 258 indicating an operating voltage level of the operating voltage $V_{OP}$ of the power signal 224 back to the power control circuit 226. The operating voltage level in the operating voltage feedback indicator 258 can be used by the power control circuit 226 to determine the power consumption by the processor-based system 200. The operating voltage level in the operating voltage feedback indicator 258 can also be used to acknowledge that a new operating voltage $V_{OP}$ of the power signal 224 has been set.

In other aspects, the power control circuit 226 is also configured to determine a desired operating frequency $F_O$ for the clock signal CLK to manage the overall power consumption of the processor-based system 200 based on the received power budget 255 from the PMC 242. The power control circuit 226 is configured to communicate an operating frequency indicator 239 indicating an operating frequency level to the clock control circuit 202 to cause the clock control circuit 202 to generate the clock signal CLK at such operating frequency $F_O$. The clock control circuit 202 can provide an operating frequency feedback indicator 241 back to the power control circuit 226 to acknowledge the receipt of an operating voltage indicator 256 and/or the actual operating frequency $F_O$ of the clock signal CLK to the power control circuit 226. For example, as discussed below, the power control circuit 226 may only instruct the power circuit 246 to decrease the operating voltage $V_{OP}$ of the power signal 224, only after the operating frequency $F_O$ of the clock signal CLK is decreased when it is desired to reduce power consumption of the processor-based system 200. In this manner, the processor 206 does not operate at an operating frequency based on the operating frequency $F_O$ of the clock signal CLK that is beyond the speed capability of the logic circuits in the processor 206 for a given operating voltage $V_{OP}$ of the power signal 224.

Also, as another example, as discussed above, the power circuit 246 can provide an operating voltage feedback indicator 258 indicating the actual operating voltage $V_{OP}$ of the power signal 224 for feedback control purposes. The power control circuit 226 may only instruct the clock control circuit 202 to increase the operating frequency $F_O$ of the clock signal CLK, after the operating voltage $V_{OP}$ of the power signal 224 is increased when it is desired to increase power consumption of the processor-based system 200. In this manner, the processor 206 does not operate at an operating frequency based on the operating frequency $F_O$ of the clock signal CLK that is beyond the speed capability of the logic circuits in the processor 206 for a given operating voltage $V_{OP}$ of the power signal 224.

With continuing reference to FIG. 2, one advantage of providing the power control circuit 226 as a processor circuit is that registers can easily be used to provide an interface between the power control circuit 226 and the clock control circuit 202. For example, the processor 206 can include an operating frequency register 248 in which the operating frequency indicator 239 can be written by the power control circuit 226 indicating a new operating frequency for the clock signal CLK. The clock control circuit 202 can be configured to read the operating frequency register 248 to determine the new operating frequency for the clock signal CLK based on the operating frequency indicator 239. Similarly, the processor 206 can also include an operating frequency feedback register 250 in which the operating frequency feedback indicator 241 can be written by the clock control circuit 202 indicating the actual operating frequency of the clock signal CLK. The power control circuit 226 can read the operating frequency feedback register 250 to obtain the operating frequency feedback indicator 241.

Also, the processor 206 can include an operating voltage register 260 in which the operating voltage indicator 256 indicating a new operating voltage level to be set for the operating voltage $V_{OP}$ of the power signal 224 can be written by the power control circuit 226. The power circuit 246 may be configured to read the operating voltage register 260 and/or the processor 206 may be configured to communicate the operating voltage indicator 256 in the operating voltage register 260 to the power circuit 246. Similarly, the processor 206 can also include an operating voltage feedback register 262 in which the operating voltage feedback indicator 258 can be written to communicate to the power control circuit 226. The power control circuit 226 can read the operating voltage feedback indicator 258 from the operating voltage feedback register 262 to obtain the operating voltage feedback indicator 258 indicating the actual operating voltage $V_{OP}$ of the power signal 224. The operating frequency register 248, the operating frequency feedback register 250, the operating voltage register 260, and the operating voltage feedback register 262 can be memory mapped registers to allow the power control circuit 226 to write and read to such registers through memory read and write operations.

Note that the power control circuit 226 in the processor 206 of the processor-based system 200 in FIG. 2 could also be configured to cause the power circuit 246 to adjust power in multiple power domains. For example, the power circuit 246 may be configured to generate the power signal 224 in one voltage domain and a second power signal 224(1) on a second power output 254(1) in a different voltage domain to power the processor 206. The processor 206 may have circuits that operate in different voltage domains requiring the separate power signals 224, 224(1) at different respective operating voltages $V_{OP}$, $V_{OP(1)}$. For example, it may be desired to operate the memory 223 of the processor 206 in a different voltage domain than the processor cores 218(1)-218(C−1) in case it is desired for the processor cores 218(1)-218(C−1) to be able to be put in a lower voltage in an idle or sleep mode, for example, to conserve power. The memory 223 may have a minimum operating voltage necessary to retain data (e.g., like static random access memory (SRAM)) than the processor cores 218(1)-218(C−1) need during lower-power modes.

As discussed in more detail below, the power control circuit 226 can be aware of the overall power budget for the processor-based system. The power budget may have been established for the processor-based system by another power management system, such as in a data center. The control processor in the processor-based system can dynamically increase the operating voltage of the power supplied to the processor-based system and/or the operating frequency if the consumed power is lower than the power budget. The power control circuit can also dynamically decrease the operating frequency and/or the operating voltage of the power supplied to the processor-based system if the consumed power is higher than the power budget. The power consumption by the processor-based system can vary based on a variety of factors including workload and particular applications executed. Thus, the power control circuit can continuously monitor the power consumption of the processor-based system in a closed-loop manner, and adjust the operating frequency and/or the operating voltage of power supplied to the processor-based system to maintain power consumption of its processor-based system within the power budget. In this manner, the processor-based system and its power control circuit can dynamically manage power consumption to achieve the desired trade-off between higher performance and power consumption within the power budget.

Figure 8:
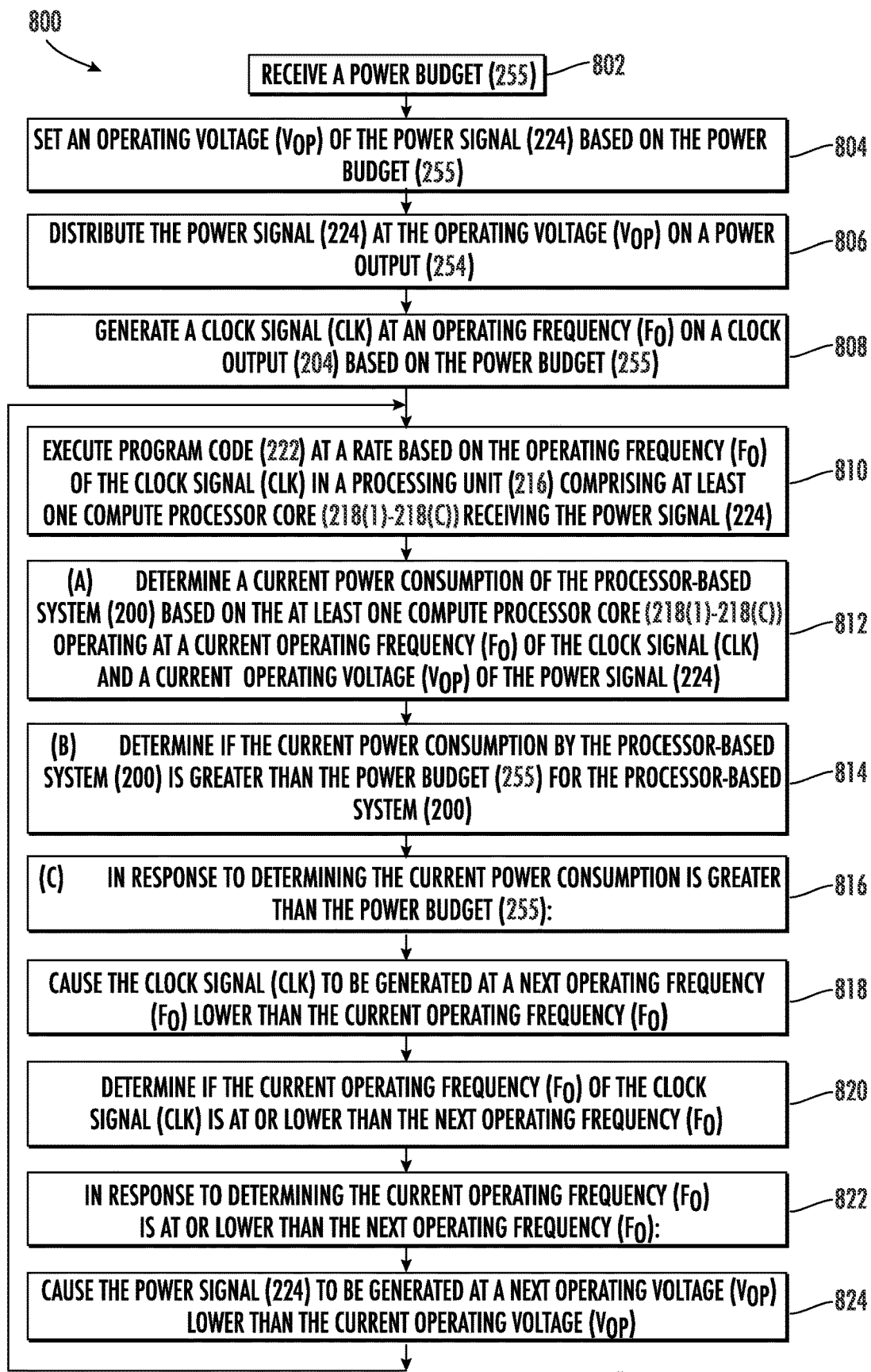
FIG. 8 is a flowchart illustrating a more detailed exemplary process of the power control circuit in the processor-based system in FIG. 2 monitoring power demand of the processor-based system and locally managing power demand by dynamically adjusting operating frequency and/or operating voltage of power supplied to the processor-based system within an established power budget.

FIG. 8 is a flowchart illustrating an exemplary process 800 of the power control circuit 226 in the processor-based system 200 in FIG. 2 monitoring power consumption of the processor-based system 200. The process 800 includes the power control circuit 226 locally managing power consumption by dynamically adjusting the operating frequency $F_O$ and/or operating voltage $V_{OP}$ of the power signal 224 supplied to the processor 206 within an established power budget 255. The process 800 in FIG. 8 is described with reference to the processor-based system 200 in FIG. 2.

In this regard, with reference to FIG. 8, the processor-based system 200, and, more particularly, the power control circuit 226 in this example, receives the power budget 255 for power consumption of the processor-based system 200 (block 802 in FIG. 8). As discussed above, the power budget 255 may be received from a separate system outside of the processor-based system 200, such as the PMC 242 in FIG. 2. The power circuit 246 sets an operating voltage $V_{OP}$ of the power signal 224 based on the power budget 255 (block 804 in FIG. 8). As discussed above and below, the power control circuit 226 determines the operating voltage $V_{OP}$ for the power signal 224 based on the power budget 255. The power control circuit 226 communicates the operating voltage indicator 256 indicating the determined operating voltage level for the operating voltage $V_{OP}$ to the power circuit 246. The power circuit 246 distributes the power signal 224 at the set operating voltage $V_{OP}$ on the power output 254 to be received by the processor 206 for powering the processor 206 including the processor cores 218(1)-218(C) (block 806 in FIG. 8). The clock control circuit 202 generates the clock signal CLK at an operating frequency $F_O$ on the clock output 204 for clocking the processor 206 based on the power budget 255 (block 808 in FIG. 8). As discussed above and below, the power control circuit 226 determines the operating frequency $F_O$ for the clock signal CLK based on the power budget 255. The power control circuit 226 communicates the operating frequency indicator 239 indicating the determined operating frequency level for the operating frequency $F_O$ to the clock control circuit 202. The compute processor cores 220 in the processor 206 execute program code 222 at a rate based on the set operating frequency $F_O$ of the clock signal CLK being powered by the power signal 224 at the operating voltage $V_{OP}$ distributed by the power circuit 246 (block 810 in FIG. 8).

As discussed above, the power control circuit 226 is configured to determine the power consumption of the processor-based system 200 and determine whether the operating frequency $F_O$ of the clock signal CLK and/or the operating voltage $V_{OP}$ of the power signal 224 should be adjusted based on the power budget 255. The power control circuit 226 may determine the power consumption of the processor-based system 200 based on the operating voltage level in the operating voltage feedback indicator 258 set by the power circuit 246 as an example. For example, the power budget 255 may be updated. Also, as another example, the previously determined and set operating frequency $F_O$ of the clock signal CLK and/or the operating voltage $V_{OP}$ of the power signal 224 may cause the power consumption of the processor-based system 200 to exceed or be below the power budget 255. Ideally, it is desired for the power consumption of the processor-based system 200 to be at or close to the power budget 255 so that the desired tradeoff of processing unit 216 performance versus efficiency in power consumption of the processor-based system 200 is achieved according to the set power budget 255.

In this regard, as shown in FIG. 8, another step in the process 800 is for the power control circuit 226 to determine a current power consumption of the processor-based system 200 based on the compute processor cores 220 operating at the current operating frequency $F_O$ of the clock signal CLK and at the current operating voltage $V_{OP}$ of the power signal 224 (block 812 in FIG. 8). The power control circuit 226 determines if the current power consumption by the processor-based system 200 is greater than the power budget 255 for the processor-based system 200 (block 814 in FIG. 8). For example, the power budget 255 may have been reduced to allow for increased power consumption and performance by another processor-based system 200 receiving power from the same power distribution network as supplies the power signal 252 to the processor-based system 200. In response to determining the current power consumption is greater than the power budget 255 (block 816 in FIG. 8), the power control circuit 226 causes the clock signal CLK to be generated by the clock control circuit 202 at a next operating frequency $F_O$ lower than the current operating frequency $F_O$ of the clock signal CLK (block 818 in FIG. 8). This is because it is desired to first reduce the operating frequency $F_O$ of the clock signal CLK before the operating voltage $V_{OP}$ of the power signal 224 is reduced so that the processor 206 can continue to operate properly. The ability of the processor 206 to operate clocked by the clock signal CLK at a given operating frequency $F_O$ requires a certain minimum voltage for the logic circuits in the processor 206 to operate properly.

The power control circuit 226 then determines if the current operating frequency $F_O$ of the clock signal CLK is at or lower than the next operating frequency $F_O$ of the clock signal CLK to determine if the clock signal CLK has settled to the new next operating frequency $F_O$ (block 820 in FIG. 8). In response to determining the current operating frequency $F_O$ of the clock signal CLK is at or lower than the next operating frequency $F_O$ (block 822 in FIG. 8), the power control circuit 226 causes the power circuit 246 to generate the power signal 224 at the determined next operating voltage $V_{OP}$ lower than the current operating voltage $V_{OP}$ (block 824 in FIG. 8).

In this manner, when the power consumption of the processor-based system 200 is to be reduced based on the power budget 255 and its current power consumption, the operating frequency $F_O$ of the clock signal CLK is reduced first before the operating voltage $V_{OP}$ of the power signal 224 is reduced. By reducing the operating frequency $F_O$ of the clock signal CLK and the operating voltage $V_{OP}$ of the power signal 224, the power consumption of the processor-based system 200 is reduced. And the processing unit 216 can continue to operate to execute program code 222 at the new operating frequency $F_O$ of the clock signal CLK and operating voltage $V_{OP}$ of the power signal 224. The power control circuit 226 is configured to repeat blocks 810-824 in FIG. 8 in a continuous fashion to continually monitor power consumption of the processor-based system 200 and adjust the operating frequency $F_O$ of the clock signal CLK and/or operating voltage $V_{OP}$ of the power signal 224, if required, based on if the power consumption is outside (i.e., higher or lower than) the power budget 255.

If however, in block 816 in FIG. 8, the power budget 255 is greater than the current power consumption of the processor-based system 200, the power control circuit 226 is also configured to increase the power consumption of the processor-based system 200 and processor 206 to achieve greater performance. In this scenario, the power budget 255 allows for increased power consumption to achieve greater performance by the processor 206. In this regard, if in block 814 in FIG. 8, the power control circuit 226 determines that the current power consumption by the processor-based system 200 is less than the power budget 255 for the processor-based system 200, the power control circuit 226 can increase power consumption of the processor-based system 200 to achieve greater performance in the processor 206. In this regard, the power control circuit 226 would first cause the power circuit 246 to generate the power signal 224 at a next determined operating voltage $V_{OP}$ higher than the current operating voltage $V_{OP}$. The power control circuit 226 sets the operating voltage $V_{OP}$ of the power signal 224 to the determined next operating voltage $V_{OP}$. This is so the processor 206 can support operation based on the clock signal CLK being at an increased operating frequency $F_O$ for increased performance. The power control circuit 226 then determines if the current operating voltage $V_{OP}$ of the power signal 224 is at or higher than the next operating voltage $V_{OP}$ to ensure that the operating voltage $V_{OP}$ of the power signal 224 has settled to the next operating voltage $V_{OP}$. The power control circuit 226 can then cause the clock control circuit 202 to generate the clock signal CLK at a next operating frequency $F_O$ higher than the current operating frequency $F_O$ of the clock signal CLK. Thus, the processor 206 operates based on the new higher operating frequency $F_O$ of the clock signal CLK and higher operating voltage $V_{OP}$ of the power signal 224 for increased performance.

If the power control circuit 226 determines that the current power consumption of the processor-based system 200 is equal or within a defined margin of the power budget 255, the power control circuit 226 can choose to not adjust the operating frequency $F_O$ of the clock signal CLK and/or the operating voltage $V_{OP}$ of the power signal 224. In this regard, the power control circuit 226 would not cause the power circuit 246 to generate the power signal 224 at a different operating voltage. The power control circuit 226 would also not cause the clock control circuit 202 to generate the clock signal CLK at new operating frequency.

The processor 206 can be configured to store a voltage-frequency table that holds voltage-frequency pairs that the power control circuit 226 can use to determine a next operating voltage $V_{OP}$ of the power signal 224 and corresponding next operating frequency $F_O$ of the clock signal CLK to manage power consumption of the processor-based system 200. For example, FIG. 9 illustrates an exemplary voltage-frequency table 900 that can be stored in memory 223 of the processor 206 in FIG. 2 and accessible by the power control circuit 226. The voltage-frequency table 900 contains a plurality of voltage-frequency pair entries 902 (1)-902(X) that each contain a voltage level entry 904(1)-904(X) configured to store an operating voltage level and a corresponding frequency level entry 906(1)-906(X) configured to store a corresponding operating frequency level. The voltage-frequency pair entries 902(1)-902(X) are "fused" together to provide complementary operating voltage and operating frequency pairs. The voltage-frequency pair entries 902(1)-902(X) can be based on a performance profile of the processor 206 and processor-based system 200. For example, the voltage-frequency table 900 may contain eight (8) voltage-frequency pair entries 902(1)-902(X). The operating voltage level and corresponding operating frequency levels stored in the voltage-frequency pair entries 902(1)-902(X) may have been determined at design or manufacture of the processor 206 in the processor-based system 200. For example, some processors 206 manufactured according to the same design may have the ability to operate at a higher operating frequency for a given operating voltage than other processors 206 based on manufacturing process variations. By the voltage-frequency table 900 being stored in memory 223, and the power control circuit 226 being configured to access the voltage-frequency table 900 in memory 223, this provides the flexibility of the voltage-frequency pair entries 902(1)-902(X) to be updated at manufacture or even during operation, if desired.

When the power control circuit 226 in the processor-based system 200 in FIG. 2 determines to set a new operating voltage $V_{OP}$ or a new operating frequency $F_O$ for the processor 206, the power control circuit 226 can consult the voltage-frequency table 900. If it is desired to increase the operating frequency $F_O$ of the clock signal CLK when power consumption of the processor-based system 200 is below the power budget 255 for increased performance, the power control circuit 226 can be configured to access the next higher voltage-frequency pair entry 902(1)-902(X) in the voltage-frequency table 900 that has the next higher operating frequency $F_O$. The power control circuit 226 can then access the operating voltage level in the voltage level entry 904(1)-904(X) in the next voltage-frequency pair entry 902(1)-902(X) to obtain the corresponding operating voltage to communicate to the power circuit 246 to increase the operating voltage $V_{OP}$ of the power signal 224. The power control circuit 226 can also access the operating frequency level in the corresponding frequency level entry 906(1)-906(X) in the next voltage-frequency pair entry 902(1)-902(X) to obtain the corresponding operating frequency to commu-nicate to the clock control circuit 202 to increase the operating frequency $F_O$ of the clock signal CLK.

Similarly, if it is desired to decrease the operating frequency $F_O$ of the clock signal CLK when power consumption of the processor-based system 200 is above the power budget 255, the power control circuit 226 can be configured to access the next voltage-frequency pair entry 902(1)-902(X) in the voltage-frequency table 900 that has the next lower operating voltage $V_{OP}$. The power control circuit 226 can then access the operating frequency level in the frequency level entry 906(1)-906(X) in the next lower voltage-frequency pair entry 902(1)-902(X) to obtain the corresponding operating frequency to communicate to the clock control circuit 202 to lower the operating frequency $F_O$ of the clock signal CLK. The power control circuit 226 can also access the operating voltage level in the corresponding voltage level entry 904(1)-904(X) in the next voltage-frequency pair entry 902(1)-902(X) to obtain the corresponding operating voltage to communicate to the power circuit 246 to lower the operating voltage $V_{OP}$ of the power signal 224.

Note that the voltage-frequency table 900 could also be directly accessible and/or stored in memory in the clock control circuit 202 to be used by the FSM circuit 234 to control the instructions to the PLL circuit 232 to adjust the operating frequency $F_O$ of the clock signal CLK. The FSM circuit 234 could access the voltage-frequency table 900 to determine incremental operating frequencies to instruct the PLL circuit 232 to adjust the operating frequency $F_O$ of the clock signal CLK in a step-wise fashion in intermediate frequency adjustments for example. For example, as shown in FIG. 9, the voltage-frequency table 900 could also include intermediate voltage-frequency pair entries 908(1)(1)-908(1)(Y)-908(X)(1)-908(X)(Y) for each voltage-frequency pair entry 902(1)-902(X) to provide intermediate operating voltage and operating frequency pairs between voltage-frequency pair entries 908(1)(1)-908(1)(Y)-908(X)(1)-908(X)(Y). For example, the power circuit 246 could use the intermediate operating voltage and operating frequency pairs in the intermediate voltage-frequency pair entries 908(1)(1)-908(1)(Y)-908(X)(1)-908(X)(Y) to adjust the operating frequency $F_O$ of the clock signal CLK and the operating voltage $V_{OP}$ of the power signal 224 in a step-wise function in granular steps to mitigate sudden larger adjustments. Each adjusting at a granular step of the adjusted the operating frequency $F_O$ of the clock signal CLK could be confirmed by the clock control circuit 202 before a next adjustment is made. The clock control circuit 202 can make the granular adjustments of the operating frequency $F_O$ of the clock signal CLK based on the intermediate voltage-frequency pair entries 908(1)(1)-908(1)(Y)-908(X)(1)-908(X)(Y). The power control circuit 226 can receive confirmation that the next determined operating frequency $F_O$ of the clock signal CLK has been achieved based on the power budget 255 through the operating frequency feedback indicator 241 from the control clock circuit 202.

FIG. 10 is a flowchart illustrating a more detailed exemplary process 1000 of the power control circuit 226 in the processor 206 of the processor-based system 200 in FIG. 2 monitoring and locally managing power consumption of the processor-based system 200. For example, as discussed below, the process 1000 in FIG. 10 can be used in conjunction with the power circuit 246 and the clock control circuit 202 to change the operating frequency $F_O$ of the clock signal CLK based on the FSM circuit 234 controlling the PLL circuit 232 in the clock control circuit 202 in FIG. 2 operational power states in a closed-loop manner.

In this regard, as shown in FIG. 10, the PMC 242 sends the new power budget 255 as the next power budget 255 to the power control circuit 226 of the processor 206 (block 1002 in FIG. 10). The power control circuit 226 initializes the power state (P-state) to a current power state (block 1004 in FIG. 10). The power control circuit 226 sets an operating frequency fn and the operating voltage Vn to the current operating frequency $F_O$ and the current operating voltage $V_{OP}$, respectively (block 1004 in FIG. 10). The current operating frequency $F_O$ and the current operating voltage $V_{OP}$ were previously determined and set and/or maintained by the power control circuit 226 in a previous iteration of the process 1000 in FIG. 10. The power control circuit 226 then reads the current power as the operating voltage feedback indicator 258 from the operating voltage feedback register 262 from the power circuit 246 to determine the current power consumed by the processor-based system 200 as the current consumed power (curr_pwr) (block 1006 in FIG. 10). Alternatively, the power circuit 246 may provide the current operating voltage $V_{OP}$ and the current $I_{OP}$ consumed to the power circuit 246 which then determines the current consumed power (curr_pwr).

With continuing reference to FIG. 10, the power control circuit 226 next determines if the current consumed power (curr_pwr) exceeds the next power budget 255 (block 1008 in FIG. 10). If so, the power control circuit 226 will start the operating frequency translation to set a lower operating frequency $F_O$ of the clock signal CLK to clock the processor 206 as the next operating frequency $F_O$ through communication through the operating frequency register 248 and the operating frequency feedback register 250 to the FSM circuit 234 and PLL circuits 232 of the clock control circuit 202. The FSM circuit 234 can be configured to gradually change or change the operating frequency $F_O$ of the clock signal CLK in a stepwise fashion by verifying that each step of the change in operating frequency $F_O$ of the clock signal CLK has taken effect before further changing the operating frequency $F_O$ of the clock signal CLK to reach the final, desired operating frequency $F_O$.

In this regard, as shown in FIG. 10, if the power control circuit 226 next determines that the current consumed power (curr_pwr) exceeds the next power budget 255 (block 1008 in FIG. 8), the power control circuit 226 determines the next operating frequency (fn) of the clock signal CLK as a lowered operating frequency $F_O$ by a desired change (Δf) in the operating frequency $F_O$ to reduce power consumption by the processor-based system 200 (block 1010 in FIG. 10). For example, as discussed above, the power control circuit 226 may determine the next lower operating frequency $F_O$ from the voltage-frequency table 900 in FIG. 9. The power control circuit 226 then communicates the determined next operating frequency (fn) to the FSM circuit 234 in the clock control circuit 202 in FIG. 2 through the operating frequency register 248 as the operating frequency indicator 239 to cause the clock control circuit 202, and more specifically the PLL circuit 232, to set the operating frequency $F_O$ of the clock signal CLK to the next operating frequency (fn) (block 1012 in FIG. 10). The power control circuit 226 determines if the operating frequency $F_O$ of the clock signal CLK has been set to the next operating frequency (fn) (block 1014 in FIG. 10). Once the power control circuit 226 determines the operating frequency $F_O$ of the clock signal CLK has been set by the clock control circuit 202 to the next operating frequency (fn) (block 1014 in FIG. 10), the power control circuit 226 sets the operating voltage $V_{OP}$ for the power signal 224 to power the processor-based system 200 to a lowered operating voltage (Vn+1) as the new operating voltage $V_{OP}$ to reduce power consumption by the processor-based system 200 (block 1016 in FIG. 10). For example, as discussed above, the power control circuit 226 may determine the next lower operating voltage $V_{OP}$ from the voltage-frequency table 900 in FIG. 9. The power control circuit 226 communicates the determined next operating voltage (Vn) to the power circuit 246 in FIG. 2 as the operating voltage indicator 256 through the operating voltage register 260 to cause the power circuit 246 to set the operating voltage $V_{OP}$ of the power signal 224 to the next operating voltage (Vn) (block 1018 in FIG. 10).

With reference to FIG. 2, in the example of this process 10000 and the processor-based system 200, the FSM circuit 234 is configured to go up and down power states to increase and decrease the operating frequency $F_O$ of the clock signal CLK in response to a change in the next operating frequency (fn) set by the power control circuit 226. In this example, the power control circuit 226 simply indicates to the clock control circuit 202 to either step up or step down the operating frequency $F_O$ of the clock signal CLK. The FSM circuit 234 controls the PLL circuit 232 to generate the clock signal CLK at the next operating frequency (fn). The FSM circuit 234 may be programmed to cause the PLL circuit 232 to generate the clock signal CLK at the next operating frequency (fn) in incremental steps after a next incremental change in the operating frequency $F_O$ of the clock signal CLK is verified in a closed-loop manner. The FSM circuit 234 may be configured to instruct the PLL circuit 232 to change the operating frequency $F_O$ of the clock signal CLK according to a PID algorithm, where the operating frequency $F_O$ of the clock signal CLK, a rate of change of the operating frequency $F_O$ of the clock signal CLK, and/or a integration of a previous history of operating frequencies $F_O$ of the clock signal CLK are used to determine the next incremental operating frequency $F_O$ for the clock signal CLK. For example, previous set operating frequencies $F_O$ of the clock signal CLK may be stored by the FSM circuit 234 in the clock control circuit 202. The clock control circuit 202 can be configured to cause the operating frequency $F_O$ of the clock signal CLK to be adjusted iteratively until the operating frequency $F_O$ of the clock signal CLK reaches the desired next operating frequency (fn) set by the power control circuit 226. The clock control circuit 202 can communicate the current operating frequency $F_O$ of the clock signal CLK as the operating frequency feedback indicator 241 in the operating frequency feedback register 250 to be read by the power control circuit 226. The clock control circuit 202 can communicate the current operating frequency $F_O$ of the clock signal CLK as the operating frequency feedback indicator 241 in the operating frequency feedback register 250 on an ongoing basis or once the current operating frequency $F_O$ of the clock signal CLK reaches the next operating frequency (fn) as set by the PLL circuit 232.

With reference back to FIG. 10, if the power control circuit 226 determines that the current consumed power (curr_pwr) does not exceed the next power budget 255 (block 1008 in FIG. 10), the operating frequency $F_O$ of the clock signal CLK and/or the operating voltage $V_{OP}$ of the power signal 224 may be increased to achieve greater performance by the processor-based system 200 and the processor 206 as previously discussed. In this regard, the power control circuit 226 sets the next operating voltage $V_{OP}$ for the power signal 224 to power the processor-based system 200 to an increased operating voltage (Vn−1) as the new operating voltage $V_{OP}$ to increase power consumed by the processor-based system 200 (block 1020 in FIG. 10).

The power control circuit 226 sets the next operating frequency $F_O$ of the clock signal CLK as an increased operating frequency $F_O$ by a desired change (fn−1) to reduce power consumption by the processor-based system 200 (block 1020 in FIG. 10). For example, as discussed above, the power control circuit 226 may determine the next increased operating voltage $V_{OP}$ and operating frequency $F_O$ from the voltage-frequency table 900 in FIG. 9. The power control circuit 226 communicates the determined next operating voltage (Vn) to the power circuit 246 in FIG. 2 as the operating voltage indicator 256 through the operating voltage register 260 to cause the power circuit 246 to set the operating voltage $V_{OP}$ of the power signal 224 to the next operating voltage (Vn) (block 1022 in FIG. 10). After the operating voltage $V_{OP}$ of the power signal 224 is confirmed by the power control circuit 226 through the operating voltage feedback register 262, the power control circuit 226 then communicates the determined next operating frequency (fn) to the FSM circuit 234 in the clock control circuit 202 in FIG. 2 through the operating frequency register 248 as the operating frequency indicator 239 to cause the clock control circuit 202, and more specifically the PLL circuit 232, to set the operating frequency $F_O$ of the clock signal CLK to the increased next operating frequency (fn) (block 1022 in FIG. 10).

The process 1000 then repeats back to block 1006 in FIG. 10 in a looping, iterative fashion to continually and dynamically determine and adjust the operating frequency $F_O$ of the clock signal CLK and/or the operating voltage $V_{OP}$ of the power signal 224 to control power consumption of the processor-based system 200 within the power budget 255.

Note that the power control circuit 226 described above in the processor 206 of the processor-based system 200 in FIG. 2 could also be configured to cause the power circuit 246 to adjust power in multiple power domains. For example, the power circuit 246 may be configured to generate a second power signal 224(1) in a different voltage domain than the power signal 224 to power the processor 206. For example, the processor 206 may have circuits that operate in different voltage domains based on the power signals 224, 224(1). For example, it may be desired to operate the memory 223 of the processor 206 in a different voltage domain than the processor cores 218(1)-218(C−1) in case it is desired for the processor cores 218(1)-218(C−1) to be able to be put in a lower voltage in an idle or sleep mode for example. The memory 223 may have a minimum operating voltage necessary to retain data (e.g., like SRAM) than the processor cores 218(1)-218(C−1) need during lower-power modes.

FIG. 11 is a block diagram of an exemplary processor-based system 1100 that includes a processor 1102 with one or more CPU cores 1104(1)-1104(P) each configured to execute computer instructions for execution. The processor-based system 1100 also includes a clock control circuit 1106 configured to locally throttle the frequency(ies) of a clock signal(s) 1108 clocking the processor 1102 to throttle the operating frequency(ies) of the processor 1102, in response to a frequency throttle event, to throttle the power demand of the processor 1102. The processor-based system 1100 could include, without limitation, the processor-based systems 200, 500, 600, 700 in FIGS. 2, 5, 6, and 7. The clock control circuit 1106 in the processor-based system 1100 in FIG. 3 can be the clock control circuits 202, 502, 602, 702 in FIGS. 2, 5, 6, and 7.

With reference to FIG. 11, the processor 1102 can also be configured to perform local dynamic power management based on controlling performance and operating power consumption. For example, one of the CPU cores 1104(P) can be a power control circuit, like the power control circuit 226 in FIG. 2, to perform local dynamic power management of the processor-based system 1100 based on controlling performance and operating power consumption. The power control circuit 1104(P) is configured to interface with a voltage regulator circuit 1110 that is configured to set the voltage level of power provided to the processor-based system 1100 for operation. The processor 1102 can include, without limitation, the processors 206, 506, 606, 706 in FIGS. 2, 5, 6, and 7 and any of the functionality for performing dynamic power management described above.

The processor-based system 1100 may be a circuit or circuits included in an electronic board card, such as, a PCB, a server, a personal computer, a desktop computer, a laptop computer, a personal digital assistant (PDA), a computing pad, a mobile device, or any other device, and may represent, for example, a server or a user's computer. The processor 1102 represents one or more general-purpose processing circuits, such as a microprocessor, central processing unit, or the like. The processor 1102 is configured to execute processing logic in computer instructions for performing the operations and steps discussed herein. The processor 1102 also includes an instruction cache 1112 for temporary, fast access memory storage of instructions. Fetched or prefetched instructions from a memory, such as from a system memory 1114 over a system bus 1116, are stored in the instruction cache 1112.

The processor 1102 and the system memory 1114 are coupled to the system bus 1116 and can intercouple peripheral devices included in the processor-based system 1100. As is well known, the processor 1102 communicates with these other devices by exchanging address, control, and data information over the system bus 1116. For example, the processor 1102 can communicate bus transaction requests to a memory controller 1118 in the system memory 1114 as an example of a slave device. Although not illustrated in FIG. 11, multiple system buses 1116 could be provided, wherein each system bus constitutes a different fabric. In this example, the memory controller 1118 is configured to provide memory access requests to a memory array 1120 in the system memory 1114. The memory array 1120 is comprised of an array of storage bit cells for storing data. The system memory 1114 may be a read-only memory (ROM), flash memory, dynamic random access memory (DRAM), such as synchronous DRAM (SDRAM), etc., and a static memory (e.g., flash memory, SRAM, etc.), as non-limiting examples.

Other devices can be connected to the system bus 1116. As illustrated in FIG. 11, these devices can include the system memory 1114, one or more input device(s) 1122, one or more output device(s) 1124, a modem 1126, and one or more display controllers 1128, as examples. The input device(s) 1122 can include any type of input device, including, but not limited to, input keys, switches, voice processors, etc. The output device(s) 1124 can include any type of output device, including, but not limited to, audio, video, other visual indicators, etc. The modem 1126 can be any device configured to allow exchange of data to and from a network 1130. The network 1130 can be any type of network, including, but not limited to, a wired or wireless network, a private or public network, a local area network (LAN), a wireless local area network (WLAN), a wide area network (WAN), a BLUETOOTH™ network, and the Internet. The modem 1126 can be configured to support any type of communications protocol desired. The processor 1102 may also be configured to access the display controller(s) 1128 over the system bus 1116 to control information sent to one or more displays 1132. The display(s) 1132 can include any type of display, including, but not limited to, a cathode ray tube (CRT), a liquid crystal display (LCD), a plasma display, etc.

The processor-based system 1100 in FIG. 11 may include a set of instructions 1134 that may include conditional control instructions that cause such instructions to either be CI instructions or CD instructions. The instructions 1134 may be stored in the system memory 1114, processor 1102, and/or instruction cache 1112 as examples of non-transitory computer-readable medium 1136. The instructions 1134 may also reside, completely or at least partially, within the system memory 1114 and/or within the processor 1102 during their execution. The instructions 1134 may further be transmitted or received over the network 1130 via the modem 1126, such that the network 1130 includes the non-transitory computer-readable medium 1136.

While the non-transitory computer-readable medium 1136 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory (RAM), a magnetic disk storage medium, an optical storage medium, flash memory devices, etc.) and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories, registers, or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium, and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A processor-based system, comprising:
a power circuit configured to set an operating voltage of a power signal based on a power budget;
a clock control circuit configured to generate a clock signal at a current frequency on a clock output;
a processing unit comprising at least one compute processor core each coupled to the clock output, each configured to execute program code at a rate based on the current frequency of the clock signal as an operating frequency; and
a throttle frequency memory configured to store a throttle frequency;
the clock control circuit configured to:
receive a frequency throttle signal indicating a frequency throttle event; and
in response to receiving the frequency throttle signal indicating the frequency throttle event:
generate the clock signal at the throttle frequency lower than the current frequency, by being configured to:
(a) generate the clock signal on the clock output at a next intermediate frequency between the current frequency and the throttle frequency; and
(b) verify the clock signal at the next intermediate frequency; and
in response to verifying the clock signal at the next intermediate frequency, repeat steps (a)-(b) one or more times until the next intermediate frequency is the throttle frequency; and
communicate a frequency throttle completion signal indicating a frequency throttle completion event indicating the clock signal at the throttle frequency; and
a power control circuit configured to:
receive the frequency throttle completion signal indicating the frequency throttle completion event; and
in response to receiving the frequency throttle completion signal indicating the frequency throttle completion event:
set the operating voltage of the power signal to a next operating voltage higher than a current operating voltage of the power signal.

2. The processor-based system of claim 1, wherein the clock control circuit comprises a phase-locked loop (PLL) circuit configured to generate the clock signal.

3. The processor-based system of claim 2, wherein the PLL circuit is configured to generate the clock signal as a function of the current frequency of the clock signal, the integration of prior current frequencies of the clock signal, and the rate of change in the current frequency of the clock signal.

4. The processor-based system of claim 1, wherein the clock control circuit comprises:
a first phase-locked loop (PLL) circuit configured to generate a first clock signal at a first frequency;
a second PLL circuit configured to generate a second clock signal at a second frequency; and
a clock selection circuit configured to receive the first clock signal and the second clock signal and pass one of the first clock signal and the second clock signal to the clock output based on a clock selection signal;
the clock control circuit further configured to generate the clock signal on the clock output at the next intermediate frequency between the current frequency and the throttle frequency, by being configured to:
(c) generate the clock selection signal to select the first clock signal from the first PLL circuit to be coupled to the clock output;
(d) cause the second PLL circuit to generate the second clock signal at the next intermediate frequency;
(e) generate the clock selection signal to select the second clock signal from the second PLL circuit to be coupled to the clock output; and
(f) cause the first PLL circuit to generate the first clock signal at the next intermediate frequency.

5. The processor-based system of claim 4, wherein the clock control circuit is further configured to repeat steps (c)-(f) until the next intermediate frequency is the throttle frequency.

6. The processor-based system of claim 1, further comprising at least one temperature monitor circuit each configured to:
detect an ambient temperature of the at least one compute processor core; and
generate the frequency throttle signal indicating the frequency throttle event in response to the detected ambient temperature exceeding a defined threshold temperature.

7. The processor-based system of claim 1, wherein the clock control circuit is configured to receive the frequency throttle signal indicating the frequency throttle event from an external device.

8. The processor-based system of claim 1, wherein:
the power circuit is further configured to distribute the power signal on a power output;
further comprising a power rail coupled to the power output; and
wherein:
the at least one compute processor core each coupled to the power rail; and
the processor-based system is further configured to, in response to the frequency throttle completion signal indicating the frequency throttle completion event, cause the power circuit to discontinue generation of the power signal.

9. The processor-based system of claim 1, wherein:
the power circuit is further configured to distribute the power signal on a power output; and
further comprising:
a power rail coupled to the power output;
the at least one compute processor core each coupled to the power rail; and
the power control circuit further configured to:
in response to receiving the frequency throttle completion signal indicating the frequency throttle completion event:
(g) determine a current power demand of the processor-based system based on the at least one compute processor core operating at the current frequency of the clock signal and the current operating voltage of the power signal;
(h) determine if the current power demand of the processor-based system is greater than the power budget for the processor-based system; and
(i) in response to determining the current power demand is less than the power budget:
cause the power circuit to generate the power signal at the next operating voltage higher than the current operating voltage;
determine if the current operating voltage of the power signal is at or higher than the next operating voltage; and
in response to determining the current operating voltage is at or higher than the than the next operating voltage:
cause the clock control circuit to generate the clock signal at a next operating frequency higher than the current frequency; and
(j) set the operating voltage of the power signal at the next operating voltage.

10. The processor-based system of claim 9, wherein the power control circuit is further configured to, in response to determining the current power demand is greater than the power budget:
cause the clock control circuit to generate the clock signal at a next operating frequency lower than the current frequency;
determine if the current frequency of the clock signal is at or lower than the next operating frequency; and
in response to determining the current frequency is at or lower than the next operating frequency:
cause the power circuit to generate the power signal at a next operating voltage lower than the current operating voltage.

11. The processor-based system of claim 9, wherein the power control circuit is further configured to:
determine if the current power demand of the processor-based system is equal to the power budget for the processor-based system; and
in response to determining the current power demand is equal to the power budget:
not cause the power circuit to generate the power signal at a next operating voltage different from current operating voltage; and
not cause the clock control circuit to generate the clock signal at a next operating frequency different than the current frequency.

12. The processor-based system of claim 10, wherein the power control circuit is configured to repeat steps (g)-(i).

13. The processor-based system of claim 1, wherein the processing unit is further configured to program the throttle frequency memory with the throttle frequency.

14. The processor-based system of claim 9, comprising:
a first integrated circuit (IC) chip comprising the power rail, the clock control circuit, the processing unit, and the power control circuit; and
a second IC chip comprising the power circuit.

15. The processor-based system of claim 14, wherein the first IC chip comprises a semiconductor die comprising the power rail, the clock control circuit, the processing unit, and the power control circuit.

16. A method of throttling an operating frequency of a processor in a processor-based system, comprising:
setting an operating voltage of a power signal based on a power budget;
generating a clock signal at a current frequency on a clock output; and
executing program code at a rate based on the current frequency of the clock signal in a processing unit comprising at least one compute processor core receiving the clock signal;
receiving a frequency throttle signal indicating a frequency throttle event; and
in response to receiving the frequency throttle signal indicating the frequency throttle event, generating the clock signal at a throttle frequency lower than the current frequency, by:
(a) generating the clock signal on the clock output at a next intermediate frequency between the current frequency and the throttle frequency; and
(b) verifying the clock signal at the next intermediate frequency; and
in response to verifying the clock signal at the next intermediate frequency, repeating steps (a)-(b) one or more times until the next intermediate frequency is the throttle frequency; and
communicating a frequency throttle completion signal indicating a frequency throttle completion event indicating the clock signal at the throttle frequency; and
receiving the frequency throttle completion signal indicating the frequency throttle completion event; and
in response to receiving the frequency throttle completion signal indicating the frequency throttle completion event:
setting the operating voltage of the power signal to a next operating voltage higher than a current operating voltage of the power signal.

17. The method of claim 16, wherein generating the clock signal on the clock output at the next intermediate frequency comprises generating the clock signal on the clock output at the next intermediate frequency based on phase-lock looping of the clock signal.

18. The method of claim 16, wherein generating the clock signal on the clock output at the next intermediate frequency comprises:
(c) generating a clock selection signal to select a first clock signal from a first phase-locked loop (PLL) circuit to be coupled to the clock output;
(d) causing a second PLL circuit to generate a second clock signal at the next intermediate frequency;
(e) generating the clock selection signal to select the second clock signal from the second PLL circuit to be coupled to the clock output; and (f) causing the first PLL circuit to generate the first clock signal at the next intermediate frequency.

19. The method of claim 18, further comprising repeating steps (c)-(f) until the next intermediate frequency is the throttle frequency.

20. The method of claim 16, further comprising:
    detecting an ambient temperature of the at least one compute processor core; and
    generating the frequency throttle signal indicating the frequency throttle event in response to the detected ambient temperature exceeding a defined threshold temperature.

21. The method of claim 16, further comprising receiving the frequency throttle signal indicating the frequency throttle event from an external device.

22. The method of claim 16, further comprising:
    distributing the power signal on a power output coupled to the at least one compute processor core; and
    causing a power circuit to discontinue generation of the power signal, in response to the frequency throttle completion signal indicating the frequency throttle completion event.

23. The method of claim 16, further comprising:
    distributing the power signal on a power output coupled to the at least one compute processor core;
    in response to receiving the frequency throttle completion signal indicating the frequency throttle completion event;

(g) determining a current power consumption of the processor-based system based on the at least one compute processor core operating at the current frequency of the clock signal and the current operating voltage of the power signal;

(h) determining if the current power consumption of the processor-based system is greater than the power budget for the processor-based system; and (i) in response to determining the current power consumption is less than the power budget:
    causing a power circuit to generate the power signal at a next operating voltage higher than the current operating voltage;
    determining if the current operating voltage of the power signal is at or higher than the next operating voltage; and
    in response to determining the current operating voltage is at or higher than the than the next operating voltage:
        causing a clock control circuit to generate the clock signal at a next operating frequency higher than the current frequency; and (j) setting the operating voltage of the power signal at the next operating voltage.

* * * * *